United States Patent
Hara et al.

(10) Patent No.: US 12,371,521 B2
(45) Date of Patent: *Jul. 29, 2025

(54) PHOTOSENSITIVE COMPOSITION, HOLOGRAM RECORDING MEDIUM USING THE SAME, HOLOGRAM OPTICAL ELEMENT, AND METHOD OF FORMING HOLOGRAM DIFFRACTION GRATING

(71) Applicant: Sony Group Corporation, Tokyo (JP)

(72) Inventors: Hisaya Hara, Tokyo (JP); Takahiro Ohe, Tokyo (JP); Kenshiro Kawasaki, Tokyo (JP)

(73) Assignee: Sony Group Corporation, Tokyo (JP)

( * ) Notice: Subject to any disclaimer, the term of this patent is extended or adjusted under 35 U.S.C. 154(b) by 182 days.

This patent is subject to a terminal disclaimer.

(21) Appl. No.: 17/625,680

(22) PCT Filed: Jun. 19, 2020

(86) PCT No.: PCT/JP2020/024165
§ 371 (c)(1),
(2) Date: Jan. 7, 2022

(87) PCT Pub. No.: WO2021/006012
PCT Pub. Date: Jan. 14, 2021

(65) Prior Publication Data
US 2022/0242985 A1    Aug. 4, 2022

(30) Foreign Application Priority Data
Jul. 8, 2019    (JP) .................. 2019-126976

(51) Int. Cl.
*G03H 1/02*   (2006.01)
*C08F 2/44*   (2006.01)
(Continued)

(52) U.S. Cl.
CPC ............. *C08F 220/34* (2013.01); *C08F 2/44* (2013.01); *C08F 2/50* (2013.01); *G03F 7/028* (2013.01);
(Continued)

(58) Field of Classification Search
None
See application file for complete search history.

(56) References Cited

U.S. PATENT DOCUMENTS 3,751,246 A * 8/1973 Printy .................... G03G 5/073
                                                    430/81
2004/0253521 A1* 12/2004 Otaki .................. G03H 1/0248
                                                    430/1
(Continued)

FOREIGN PATENT DOCUMENTS

CN    108530957 A    9/2018
CN    113316746 A    8/2021
(Continued)

OTHER PUBLICATIONS

"Carbazole" entry in Chemical Book webpage no date, downloaded Jun. 25, 2024).*

(Continued)

*Primary Examiner* — Martin J Angebranndt
(74) *Attorney, Agent, or Firm* — K&L Gates LLP

(57) ABSTRACT

To provide a photosensitive composition capable of further improving diffraction characteristics.

The present technology provides a photosensitive composition including: at least a compound represented by the following general formula (1); a binder resin; and a photoinitiator.

(Continued)

(Chem. 1)

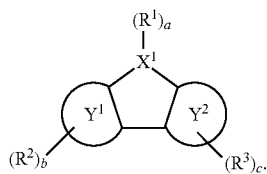

(1)

In the general formula (1), $X^1$ represents an oxygen atom, a nitrogen atom, a phosphorus atom, a caron atom, or a silicon atom.
$Y^1$ and $Y^2$ each represent a benzene ring or a naphthalene ring, and both $Y^1$ and $Y^2$ do not represent benzene rings.
$R^1$ to $R^3$ each represent a hydrogen or a substituent group represented by $*-Z^1(R^4)_d$ (* represents a bonding site).
$Z^1$ represents a single bond, a saturated hydrocarbon group having a valence of 2 or higher, or an unsaturated hydrocarbon group having a valence of 2 or higher, and the saturated hydrocarbon group or the unsaturated hydrocarbon group may have an ether bond and/or a thioether bond.
$R^4$ represents a hydrogen or a polymerizable substituent group.

6 Claims, 1 Drawing Sheet

(51) Int. Cl.
| | |
|---|---|
| *C08F 2/50* | (2006.01) |
| *C08F 220/34* | (2006.01) |
| *G03F 7/028* | (2006.01) |
| *G03F 7/032* | (2006.01) |
| *G03H 1/04* | (2006.01) |

(52) U.S. Cl.
CPC ............. *G03F 7/032* (2013.01); *G03H 1/02* (2013.01); *G03H 1/041* (2013.01); *G03H 2001/0216* (2013.01); *G03H 2223/23* (2013.01); *G03H 2260/12* (2013.01)

(56) References Cited

U.S. PATENT DOCUMENTS

| | | |
|---|---|---|
| 2013/0020561 A1 | 1/2013 | Suzuki et al. |
| 2013/0034805 A1* | 2/2013 | Hayashida .............. G03F 7/027 430/2 |
| 2018/0251626 A1 | 9/2018 | Someya et al. |
| 2019/0202946 A1 | 7/2019 | Hara et al. |
| 2022/0101878 A1* | 3/2022 | Ohe ................... G11B 7/24044 |
| 2022/0289678 A1* | 9/2022 | Ohe ....................... G02B 1/041 |
| 2024/0071417 A1* | 2/2024 | Ozawa ................ C07D 209/82 |
| 2024/0085609 A1* | 3/2024 | Hara .................. G11B 7/24044 |

FOREIGN PATENT DOCUMENTS

| | | | | |
|---|---|---|---|---|
| DE | 112020000633 T5 | | 10/2021 | |
| JP | 62178268 A | * | 8/1987 | .......... G03G 5/0629 |
| JP | 11202740 A | * | 7/1999 | |
| JP | 2001-125474 A | | 5/2001 | |
| JP | 2015-193809 A | | 11/2015 | |
| JP | 2016-069637 A | | 5/2016 | |
| JP | 2016-094597 A | | 5/2016 | |
| JP | 2016191733 A | * | 11/2016 | |
| JP | 6117624 B2 | | 4/2017 | |
| JP | 2018-145263 A | | 9/2018 | |
| JP | 2019-071484 A | | 5/2019 | |
| SU | 777027 | * | 11/1980 | |
| WO | WO-2010137501 A1 | * | 12/2010 | ............ C08F 220/30 |
| WO | WO-2018043593 A1 | * | 3/2018 | ................ C08F 2/40 |
| WO | WO-2020158796 A1 | * | 8/2020 | ................ C08F 2/44 |

OTHER PUBLICATIONS

"7H-dibenzo[C,G]carbazole" entry in Chemical Book webpage (last updated May 24, 2024, downloaded Jun. 25, 2024).*
International Search Report issued in connection with PCT/JP2020/024165, mailed Sep. 8, 2020 (3 pages).

* cited by examiner

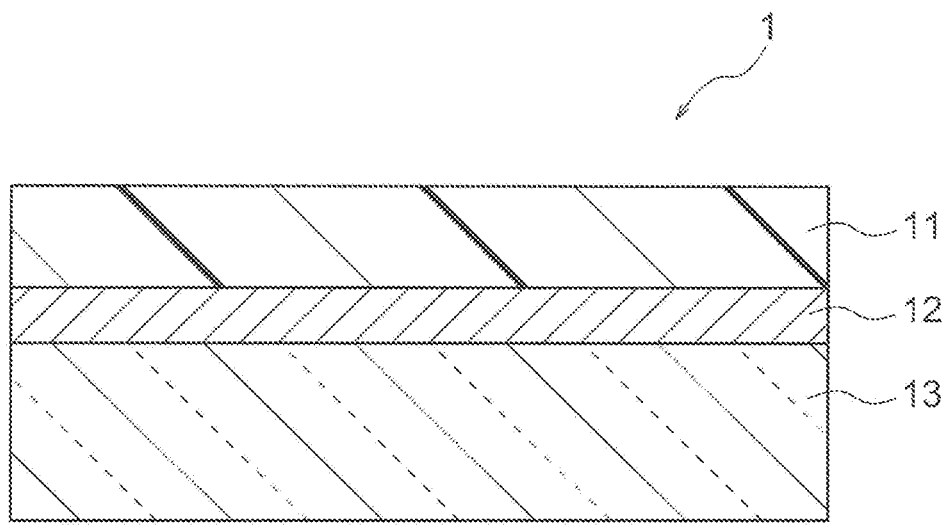

PHOTOSENSITIVE COMPOSITION, HOLOGRAM RECORDING MEDIUM USING THE SAME, HOLOGRAM OPTICAL ELEMENT, AND METHOD OF FORMING HOLOGRAM DIFFRACTION GRATING

TECHNICAL FIELD

The present technology relates to a photosensitive composition, a hologram recording medium using the same, a hologram optical element, and a method of forming a hologram diffraction grating.

BACKGROUND ART

Holograms are obtained by recording light and dark (interference) patterns of light as patterns of refractive indices or the like on a photosensitive material or the like, and are widely used in the fields of optical information processing, security, medicine, head-up display, and the like. Holograms are attracting attention as next-generation recording media because they are capable of recording three-dimensional information relating to an object in a large amount as optical information.

So far, various proposals have been made for materials for holograms. For example, Patent Literature 1 proposes a photosensitive composition for recording a volume hologram including (a) a radical polymerizable compound having a specific structure, (b) a photoinitiator, and (c) a compound having a refractive index different from that of the radical polymerizable compound, characterized by containing 10 to 95 wt % of the radical polymerizable compound (a).

CITATION LIST

Patent Literature

Patent Literature 1: Japanese Patent Application Laid-open No. 2001-125474

DISCLOSURE OF INVENTION

Technical Problem

However, in the hologram technology, it is required to further improve diffraction characteristics and the transparency of the hologram. In this regard, it is an object of the present technology to provide a photosensitive composition, a hologram recording medium, a hologram optical element, an optical apparatus using the same, an optical part, and a method of forming a hologram diffraction grating that are capable of further improving diffraction characteristics and the transparency of the hologram.

Solution to Problem

As a result of extensive studies to achieve the above-mentioned object, the present inventors have succeeded in further improving diffraction characteristics and the transparency of the hologram, thereby completing the present technology.

That is, the present technology provides a photosensitive composition containing at least: a compound represented by the following general formula (1); a binder resin; and a photoinitiator.

[Chem. 1]

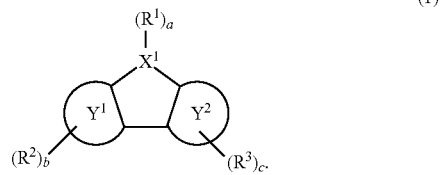

In the general formula (1), $X^1$ represents an oxygen atom, a nitrogen atom, a phosphorus atom, a caron atom, or a silicon atom. Where $X^1$ represents an oxygen atom, where $X^1$ represents a nitrogen atom or a phosphorus atom, and where $X^1$ represents a caron atom or a silicon atom, a represents 0, a represents 1, and a represents 2, respectively.

$Y^1$ and $Y^2$ each represent a benzene ring or a naphthalene ring, and both $Y^1$ and $Y^2$ do not represent benzene rings. Where $Y^1$ or $Y^2$ represents a benzene ring, b or c corresponding to $Y^1$ or $Y^2$ that is the benzene ring represents 4. Where $Y^1$ and/or $Y^2$ represent(s) a naphthalene ring(s), b and/or c corresponding to $Y^1$ and/or $Y^2$ that is(are) the naphthalene ring(s) represent(s) 6.

$R^1$ to $R^3$ each represent a hydrogen or a substituent group represented by $*-Z^1(R^4)_d$ (* represents a bonding site). Where $R^1$ to $R^3$ respectively include a plurality of $R^1$, a plurality of $R^2$, and a plurality of $R^3$, the plurality of $R^1$ to $R^3$ may be the same or different from each other, but all of $R^1$ to $R^3$ in the general formula (1) do not represent hydrogens.

$Z^1$ represents a single bond, a saturated hydrocarbon group having a valence of 2 or higher, or an unsaturated hydrocarbon group having a valence of 2 or higher, and the saturated hydrocarbon group or the unsaturated hydrocarbon group may have an ether bond and/or a thioether bond. Where $Z^1$ represents a single bond and where $Z^1$ represents a saturated hydrocarbon group or an unsaturated hydrocarbon group, d represents 1 and d represents an integer of 1 or more, respectively.

$R^4$ represents a hydrogen or a polymerizable substituent group. Where $R^4$ includes a plurality of $R^4$, the plurality of $R^4$ may be the same or different from each other but all $R^4$ in the general formula (1) do not represent hydrogens.

The photosensitive composition may contain a compound in which $X^1$ in the general formula (1) represents a nitrogen atom.

Then, the compound may be a compound represented by the following general formula (1-1).

(Chem. 2)

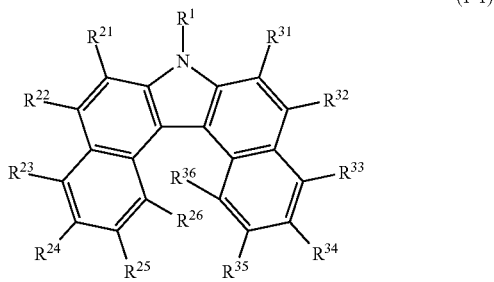

In the general formula (1-1), $R^1$, $R^{21}$ to $R^{26}$, and $R^{31}$ to $R^{36}$ each represent a hydrogen or a substituent group represented by *—$Z^1(R^4)_d$ (* represents a bonding site). $R^1$, $R^{21}$ to $R^{26}$, and $R^{31}$ to $R^{36}$ may be the same or different from each other. However, all of $R^1$, $R^{21}$ to $R^{26}$, and $R^{31}$ to $R^{36}$ in the general formula (1-1) do not represent hydrogens.

$Z^1$ represents a single bond, a saturated hydrocarbon group having a valence of 2 or higher, or an unsaturated hydrocarbon group having a valence of 2 or higher, and the saturated hydrocarbon group or the unsaturated hydrocarbon group may have an ether bond and/or a thioether bond. Where $Z^1$ represents a single bond and where $Z^1$ represents a saturated hydrocarbon group or an unsaturated hydrocarbon group, d represents 1 and d represents an integer of 1 or more, respectively.

$R^4$ represents a hydrogen or a polymerizable substituent group. Where $R^4$ includes a plurality of $R^4$, the plurality of $R^4$ may be the same or different from each other but all $R^4$ in the general formula (1-1) do not represent hydrogens.

Further, the photosensitive composition may contain a compound in which $X^1$ in the general formula (1) represents a carbon atom.

Then, the compound may be a compound represented by the following general formula (1-2).

(Chem. 3)

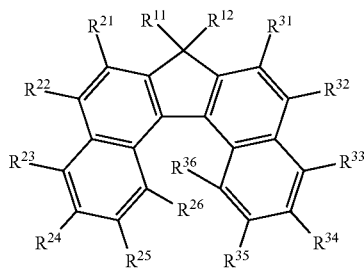

(1-2)

In the general formula (1-2), $R^{11}$, $R^{12}$, $R^{21}$ to $R^{26}$, and $R^{31}$ to $R^{36}$ each represent a hydrogen or a substituted group represented by *—$Z^1(R^4)_d$ (* represents a bonding site). $R^{11}$, $R^{12}$, $R^{21}$ to $R^{26}$, and $R^{31}$ to $R^{36}$ may be the same or different from each other. However, all of $R^{11}$, $R^{12}$, $R^{21}$ to $R^{26}$, and $R^{31}$ to $R^{36}$ in the general formula (1-2) do not represent hydrogens.

$Z^1$ represents a single bond, a saturated hydrocarbon group having a valence of 2 or higher, or an unsaturated hydrocarbon group having a valence of 2 or higher, and the saturated hydrocarbon group or the unsaturated hydrocarbon group may have an ether bond and/or a thioether bond. Where $Z^1$ represents a single bond and where $Z^1$ represents a saturated hydrocarbon group or an unsaturated hydrocarbon group, d represents 1 and d represents an integer of 1 or more, respectively.

$R^4$ represents a hydrogen or a polymerizable substituent group. Where $R^4$ includes a plurality of $R^4$, the plurality of $R^4$ may be the same or different from each other, but all of $R^4$ in the general formula (1-2) do not represent hydrogens.

The present technology provides also a hologram recording medium using the photosensitive composition.

Further, the present technology provides also a hologram optical element using the hologram recording medium.

Further, the present technology provides also a method of forming a hologram diffraction grating including selectively causing a hologram recording medium that includes a photosensitive layer containing at least a polymerizable compound containing a compound represented by the following general formula (1), a binder resin, and a photoinitiator to react by electromagnetic radiation whose amplitude intensity has been spatially modulated.

(Chem. 4)

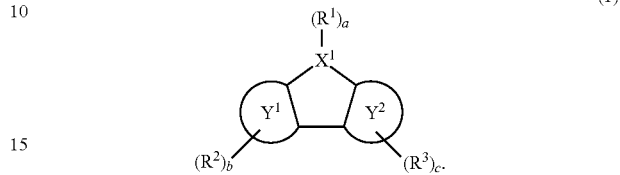

(1)

In the general formula (1), $X^1$ represents an oxygen atom, a nitrogen atom, a phosphorus atom, a caron atom, or a silicon atom. Where $X^1$ represents an oxygen atom, where $X^1$ represents a nitrogen atom or a phosphorus atom, and where $X^1$ represents a caron atom or a silicon atom, a represents 0, a represents 1, and a represents 2, respectively.

$Y^1$ and $Y^2$ each represent a benzene ring or a naphthalene ring, and both $Y^1$ and $Y^2$ do not represent benzene rings. Where $Y^1$ or $Y^2$ represents a benzene ring, b or c corresponding to $Y^1$ or $Y^2$ that is the benzene ring represents 4. Where $Y^1$ and/or $Y^2$ represent(s) a naphthalene ring(s), b and/or c corresponding to $Y^1$ and/or $Y^2$ that is(are) the naphthalene ring(s) represent(s) 6.

$R^1$ to $R^3$ each represent a hydrogen or a substituent group represented by *—$Z^1(R^4)_d$ (* represents a bonding site). Where $R^1$ to $R^3$ respectively include a plurality of $R^1$, a plurality of $R^2$, and a plurality of $R^3$, the plurality of $R^1$ to $R^3$ may be the same or different from each other, but all of $R^1$ to $R^3$ in the general formula (1) do not represent hydrogens.

$Z^1$ represents a single bond, a saturated hydrocarbon group having a valence of 2 or higher, or an unsaturated hydrocarbon group having a valence of 2 or higher, and the saturated hydrocarbon group or the unsaturated hydrocarbon group may have an ether bond and/or a thioether bond. Where $Z^1$ represents a single bond and where $Z^1$ represents a saturated hydrocarbon group or an unsaturated hydrocarbon group, d represents 1 and d represents an integer of 1 or more, respectively.

$R^4$ represents a hydrogen or a polymerizable substituent group. Where $R^4$ includes a plurality of $R^4$, the plurality of $R^4$ may be the same or different from each other but all $R^4$ in the general formula (1) do not represent hydrogens.

BRIEF DESCRIPTION OF DRAWINGS

FIG. 1 is a cross-sectional view schematically showing an example of a hologram recording medium according to an embodiment of the present technology.

MODE(S) FOR CARRYING OUT THE INVENTION

Hereinafter, suitable embodiments for carrying out the present technology will be described. Note that the embodiments to be described below show representative embodiments of the present technology, and the scope of the present technology is not limited to these embodiments.

Note that the description of the present technology will be given in the following order.

1. Summary of present technology
2. First embodiment (photosensitive composition)
2-1. Photosensitive composition
2-2. Polymerizable compound
2-3. Binder resin
2-4. Photoinitiator
2-5. Other components
2-6. Method of producing photosensitive composition
3. Second embodiment (hologram recording medium)
3-1. Hologram recording medium
3-2. Photosensitive layer
3-3. Transparent base material
3-4. Method of producing hologram recording medium
4. Third embodiment (hologram optical element)
4-1. Hologram optical element
4-2. Method of producing hologram optical element
5. Fourth embodiment (optical apparatus, and optical part)
6. Fifth embodiment (method of forming hologram diffraction grating)

1. Overview of Present Technology

First, an overview of the present technology will be described.

The present technology relates to a photosensitive composition, a hologram recording medium using the same, a hologram optical element, and a method of producing a hologram diffraction grating.

In recent years, holograms are expected to be applied to a see-through display and the like. Holograms for a see-through display are required to have a high refractive index modulation amount (Δn) and be excellent in transparency. In order to obtain a hologram having a high refractive index modulation amount (Δn) and being excellent in transparency, it is desirable that a photosensitive composition contains a compound satisfying the following points.

The refractive index difference from another material to be separated is large.

It is favorably separated in accordance with the light intensity differences during exposure.

It has little absorption in a visible area.

However, an effective polymerizable compound sufficiently satisfying the points described above has not been found so far, and a photosensitive composition capable of obtaining a hologram having a high refractive index modulation amount (Δn) and being excellent in transparency has not been found.

As a result of various studies, the present inventors have found that, by using a polymerizable compound having a specific structure, a photosensitive composition that has a high refractive index modulating quantity (Δn) and is capable of obtaining a hologram excellent in transparency can be obtained.

That is, the present technology is capable of providing, by combining a compound having a specific structure, a binder resin, and a photoinitiator with each other, a photosensitive composition having excellent diffraction characteristics and transparency, a hologram recording medium using the same, a hologram optical element, and a method of forming a hologram diffraction grating.

2. First Embodiment (Photosensitive Composition)

[2-1. Photosensitive Composition]
A photosensitive composition according to a first embodiment of the present technology is a photosensitive composition containing at least a compound represented by the following general formula (1), a binder resin, and a photoinitiator.

In accordance with the photosensitive composition according to this embodiment, it is possible to obtain a hologram having excellent diffraction characteristics and transparency. Each component will be described below in detail.

[2-2. Polymerizable Compound]
The photosensitive composition according to this embodiment contains a compound represented by the following general formula (1). The compound has a high refractive index and has favorable transparency and solubility in an organic solvent.

(Chem. 5)

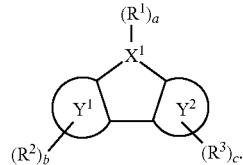

(1)

In the general formula (1), $X^1$ represents an oxygen atom, a nitrogen atom, a phosphorus atom, a caron atom, or a silicon atom. Where $X^1$ represents an oxygen atom, where $X^1$ represents a nitrogen atom or a phosphorus atom, and where $X^1$ represents a caron atom or a silicon atom, a represents 0, a represents 1, and a represents 2, respectively.

$Y^1$ and $Y^2$ each represent a benzene ring or a naphthalene ring, and both $Y^1$ and $Y^2$ do not represent benzene rings. Where $Y^1$ or $Y^2$ represents a benzene ring, b or c corresponding to $Y^1$ or $Y^2$ that is the benzene ring represents 4. Where $Y^1$ and/or $Y^2$ represent(s) a naphthalene ring(s), b and/or c corresponding to $Y^1$ and/or $Y^2$ that is(are) the naphthalene ring(s) represent(s) 6.

$R^1$ to $R^3$ each represent a hydrogen or a substituent group represented by $*-Z^1(R^4)_d$ (* represents a bonding site). Where $R^1$ to $R^3$ respectively include a plurality of $R^1$, a plurality of $R^2$, and a plurality of $R^3$, the plurality of $R^1$ to $R^3$ may be the same or different from each other, but all of $R^1$ to $R^3$ in the general formula (1) do not represent hydrogens.

$Z^1$ represents a single bond, a saturated hydrocarbon group having a valence of 2 or higher, or an unsaturated hydrocarbon group having a valence of 2 or higher, and the saturated hydrocarbon group or the unsaturated hydrocarbon group may have an ether bond and/or a thioether bond. Where $Z^1$ represents a single bond and where $Z^1$ represents a saturated hydrocarbon group or an unsaturated hydrocarbon group, d represents 1 and d represents an integer of 1 or more, respectively.

$R^4$ represents a hydrogen or a polymerizable substituent group. Where $R^4$ includes a plurality of $R^4$, the plurality of $R^4$ may be the same or different from each other but all $R^4$ in the general formula (1) do not represent hydrogens.

In the general formula (1), $X^1$ represents an oxygen atom, a nitrogen atom, a phosphorus atom, a caron atom, or a silicon atom. Further, it is considerable that the effects of the present technology can be expected also in the group 14 element, the group 15 element, and the group 16 element other than the above (except for the transitional metal).

Among the atoms described above, an oxygen atom, a nitrogen atom, and a carbon atom, which are typical elements of an organic compound, are favorable because of the ease of synthesizing a compound, and the respective atomic refractive indexes are an oxygen atom: 1.6 to 2.2, a nitrogen atom: 3.5 to 4.4, and a carbon atom: 1.7 to 2.4 ("KOGAKU", the Japanese Journal of Optics, Vol. 44 No. 8, 2015, p 298-303). In this embodiment, from the viewpoint of obtaining a compound having a high refractive index, $X^1$ in the general formula (1) is favorably a nitrogen atom having a high value of an atomic refractive index.

That is, the polymerizable compound according to this embodiment may have the following structure.

(Chem. 6)

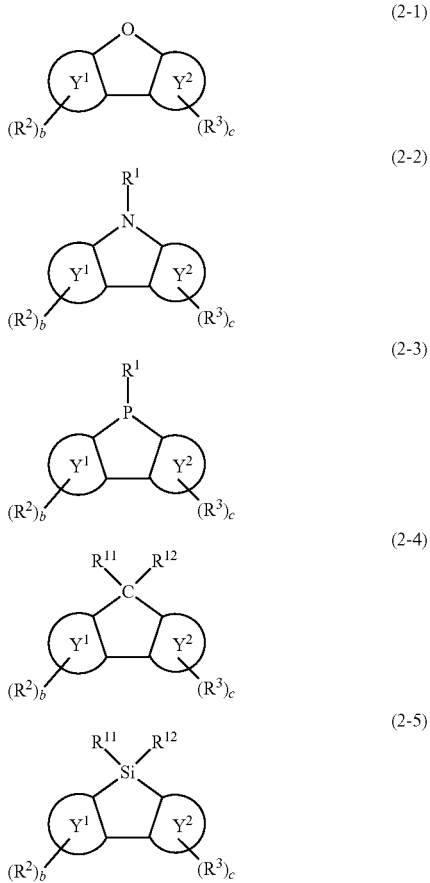

In the general formulae (2-1) to (2-5), $Y^1$ and $Y^2$ each represent a benzene ring or a naphthalene ring, and both $Y^1$ and $Y^2$ do not represent benzene rings. Where $Y^1$ or $Y^2$ represents a benzene ring, b or c corresponding to $Y^1$ or $Y^2$ that is the benzene ring represents 4. Where $Y^1$ and/or $Y^2$ represent(s) a naphthalene ring(s), b and/or c corresponding to $Y^1$ and/or $Y^2$ that is(are) the naphthalene ring(s) represent(s) 6.

$R^1$, $R^2$, $R^3$, $R^{11}$, and $R^{12}$ each represent a hydrogen or a substituent group represented by *—$Z^1(R^4)_d$ (* represents a bonding site). Where $R^1$ to $R^3$ include a plurality of $R^1$, a plurality of $R^2$, and a plurality of $R^3$, the plurality of $R^1$ to the plurality of $R^3$ may be the same or different from each other, but all of $R^1$, $R^2$, $R^3$, $R^{11}$, and $R^{12}$ in the general formulae (2-1) to (2-5) do not represent hydrogens.

$Z^1$ represents a single bond, a saturated hydrocarbon group having a valence of 2 or higher, or an unsaturated hydrocarbon group having a valence of 2 or higher, and the saturated hydrocarbon group or the unsaturated hydrocarbon group may have an ether bond and/or a thioether bond. Where $Z^1$ represents a single bond and where $Z^1$ represents a saturated hydrocarbon group or an unsaturated hydrocarbon group, d represents 1 and d represents an integer of 1 or more, respectively.

$R^4$ represents a hydrogen or a polymerizable substituent group. Where $R^4$ includes a plurality of $R^4$, the plurality of $R^4$ may be the same or different from each other, but all of $R^4$ in the general formulae (2-1) to (2-5) do not represent hydrogens.

Further, in the general formula (1) described above, $Y^1$ and $Y^2$ each represent a benzene ring or a naphthalene ring, and both $Y^1$ and $Y^2$ do not represent benzene rings.

The molecular refractive indexes of phenyl ($C_6H_5$) and naphthyl ($C_{10}H_7$) are phenyl ($C_6H_5$): 25.5 and naphthyl ($C_{10}H_7$): 43.3 ("KOGAKU", the Japanese Journal of Optics, Vol. 44 No. 8, 2015, p 298-303). In this embodiment, from the viewpoint of obtaining a compound having a high refractive index, $Y^1$ and $Y^2$ are favorably naphthalene rings having a high value of a molecular refractive index.

That is, the compound according to this embodiment may have the following structure.

(Chem. 7)

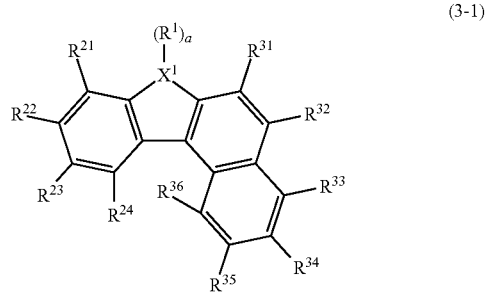

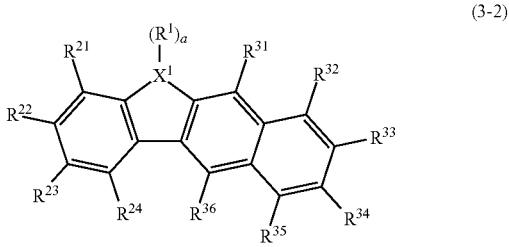

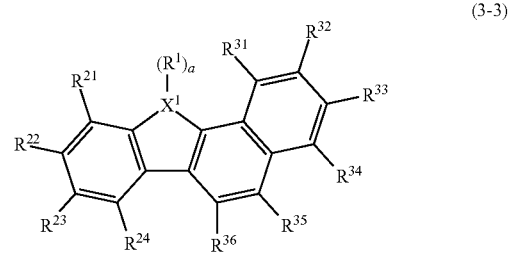

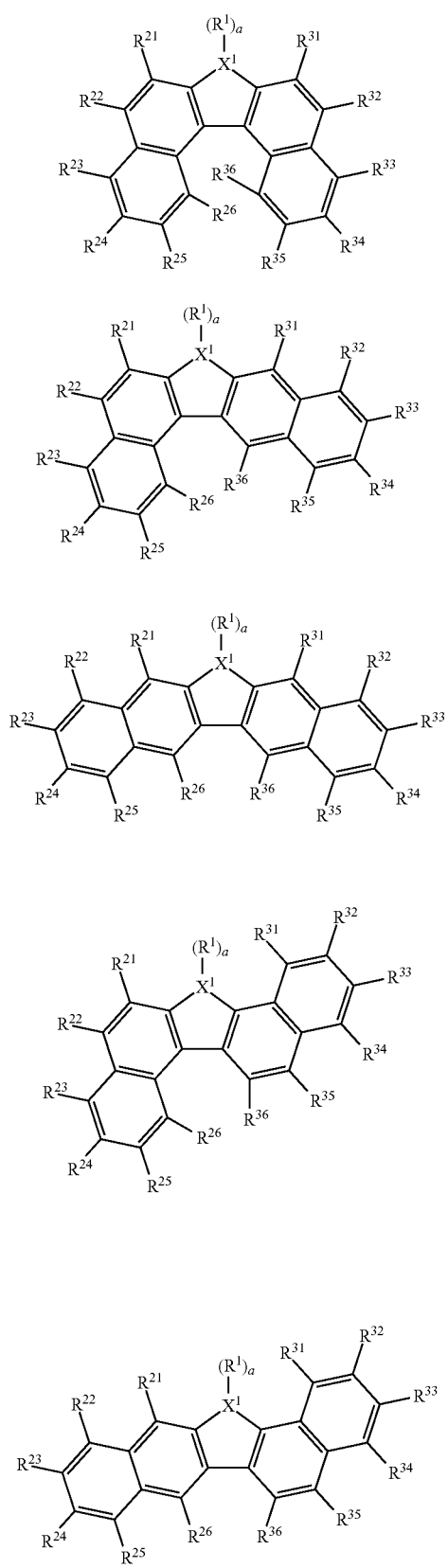

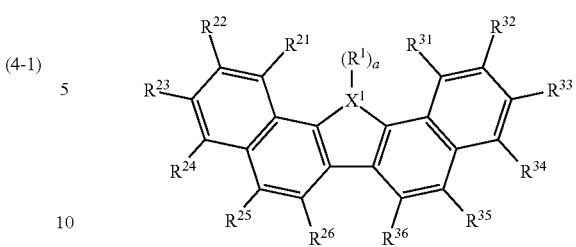

In the general formulae (3-1) to (3-3) and (4-1) to (4-6), $X^1$ represents an oxygen atom, a nitrogen atom, a phosphorus atom, a caron atom, or a silicon atom. Where $X^1$ represents an oxygen atom, where $X^1$ represents a nitrogen atom or a phosphorus atom, and where $X^1$ represents a caron atom or a silicon atom, a represents 0, a represents 1, and a represents 2, respectively.

$R^1$, $R^{21}$ to $R^{26}$, and $R^{31}$ to $R^{36}$ each represent a hydrogen or a substituent group represented by *—$Z^1(R^4)_d$ (* represents a bonding site). $R^1$, $R^{21}$ to $R^{26}$, and $R^{31}$ to $R^{36}$ may be the same or different from each other. Further, in the case where $R^1$ includes a plurality of $R^1$, the plurality of $R^1$ may be the same or different from each other. However, all of $R^1$, $R^{21}$ to $R^{26}$, and $R^{31}$ to $R^{36}$ in the general formulae (3-1) to (3-3) and (4-1) to (4-6) do not represent hydrogens.

$Z^1$ represents a single bond, a saturated hydrocarbon group having a valence of 2 or higher, or an unsaturated hydrocarbon group having a valence of 2 or higher, and the saturated hydrocarbon group or the unsaturated hydrocarbon group may have an ether bond and/or a thioether bond. Where $Z^1$ represents a single bond and where $Z^1$ represents a saturated hydrocarbon group or an unsaturated hydrocarbon group, d represents 1 and d represents an integer of 1 or more, respectively.

$R^4$ represents a hydrogen or a polymerizable substituent group. Where $R^4$ includes a plurality of $R^4$, the plurality of $R^4$ may be the same or different from each other, but all of $R^4$ in the general formulae (3-1) to (3-3) and (4-1) to (4-6) do not represent hydrogens.

In the general formula (1) described above, $Z^1$ represents a single bond, a saturated hydrocarbon group having a valence of 2 or higher, or an unsaturated hydrocarbon group having a valence of 2 or higher. The saturated hydrocarbon group or the unsaturated hydrocarbon group may have an ether bond and/or a thioether bond.

Where $Z^1$ represents a saturated hydrocarbon group having a valence of 2 or higher, the saturated hydrocarbon group may be a linear, branched, or cyclic substituted or unsubstituted hydrocarbon group. In general, an organic compound tends to obtain solubility more easily as the number of simple carbon chains increases, while it tends to have a lower refractive index as the number of simple carbon chains increases. Therefore, the saturated hydrocarbon group favorably has the number of simple carbon chains of 1 to 15, and, more favorably, 1 to 10.

Further, where $Z^1$ represents an unsaturated hydrocarbon group having a valence of 2 or higher, the unsaturated hydrocarbon group may be a linear, branched, or cyclic substituted or unsubstituted hydrocarbon group, or an aromatic group. The unsaturated hydrocarbon group favorably has the number of simple carbon chains of 1 to 15, and more favorably, 1 to 10. Where the unsaturated hydrocarbon group has an aromatic group, it is favorable that the aromatic group is a substituted or unsubstituted aromatic group having a valence of 2 or higher, which is represented by the following chemical formulae (5-1) to (5-8). When four or more benzene rings are linearly connected, it may be unfavorably from the viewpoint of transparency because it has absorbance in a visible light area and has a color. Therefore, the aromatic group favorably has a structure in which four or more benzene rings are not linearly aligned, and a benzene ring, a naphthalene ring, or an anthracene ring is favorable as a linear shape.

(Chem. 9)

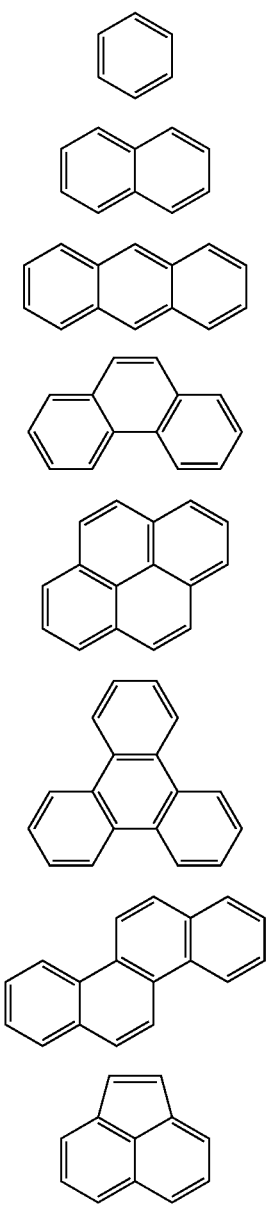

(5-1)

(5-2)

(5-3)

(5-4)

(5-5)

(5-6)

(5-7)

(5-8)

In the general formula (1) described above, examples of the polymerizable substituent group indicated by $R^4$ include those having a polymerizable unsaturated group or those having a reactive substituent group. Examples of those having a polymerizable unsaturated group include a vinyl group, an acryl group, a methacrylic group, an acrylamide group, a methacrylamide group, a cyanoacrylate group, a cyanomethacrylate group, a vinyl ether group, a vinyl cyanide group, a nitrated vinyl group, a conjugated polyene group, a halogenated vinyl group, a vinyl ketone group, and a styryl group. Examples of those having a reactive substituent group include an epoxy group, an oxetane group, a hydroxy group, an amino group, a carboxyl group, an acid anhydride group, an acid halide group, and an isocyanate group.

In the general formula (1) described above, it is favorable that $X^1$ represents a nitrogen atom and $Y^1$ and $Y^2$ each represent a naphthalene ring. That is, the compound is favorably a compound represented by the following general formula (1-1).

(Chem. 10)

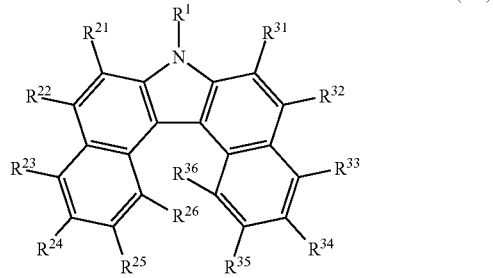

(1-1)

In the general formula (1-1), $R^1$, $R^{21}$ to $R^{26}$, and $R^{31}$ to $R^{36}$ each represent a hydrogen or a substituent group represented by *—$Z^1(R^4)_d$ (* represents a bonding site). $R^1$, $R^{21}$ to $R^{26}$, and $R^{31}$ to $R^{36}$ may be the same or different from each other. However, all of $R^1$, $R^{21}$ to $R^{26}$, and $R^{31}$ to $R^{36}$ do not represent hydrogens.

$Z^1$ represents a single bond, a saturated hydrocarbon group having a valence of 2 or higher, or an unsaturated hydrocarbon group having a valence of 2 or higher, and the saturated hydrocarbon group or the unsaturated hydrocarbon group may have an ether bond and/or a thioether bond. Where $Z^1$ represents a single bond and where $Z^1$ represents a saturated hydrocarbon group or an unsaturated hydrocarbon group, d represents 1 and d represents an integer of 1 or more, respectively.

$R^4$ represents a hydrogen or a polymerizable substituent group. Where $R^4$ includes a plurality of $R^4$, the plurality of $R^4$ may be the same or different from each other but all $R^4$ in the general formula (1-1) do not represent hydrogens.

In the general formula (1-1), it is favorable that $R^1$ represents a substituent groups represented by *—$Z^1(R^4)_d$ (* represents a bonding site) and $R^{21}$ to $R^{26}$ and $R^{31}$ to $R^{36}$ each represent a hydrogen.

Further, in the general formula (1) described above, it is favorable that $X^1$ represents a carbon atom and $Y^1$ and $Y^2$ each represents a naphthalene ring. That is, it is favorable that the compound is a compound represented by the following general formula (1-2).

(Chem. 11)

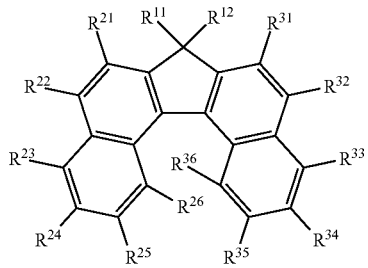

(1-2)

In the general formula (1-2), $R^{11}$, $R^2$, $R^{21}$ to $R^{26}$, and $R^{31}$ to $R^{36}$ each represent a hydrogen or a substituted group represented by *—$Z^1(R^4)_d$ (* represents a bonding site). $R^{11}$, $R^{12}$, $R^{21}$ to $R^{26}$, and $R^{31}$ to $R^{36}$ may be the same or different from each other. However, all of $R^{11}$, $R^{12}$, $R^{21}$ to $R^{26}$, and $R^{31}$ to $R^{36}$ in the general formula (1-2) do not represent hydrogens.

$Z^1$ represents a single bond, a saturated hydrocarbon group having a valence of 2 or higher, or an unsaturated hydrocarbon group having a valence of 2 or higher, and the saturated hydrocarbon group or the unsaturated hydrocarbon group may have an ether bond and/or a thioether bond. Where $Z^1$ represents a single bond and where $Z^1$ represents a saturated hydrocarbon group or an unsaturated hydrocarbon group, d represents 1 and d represents an integer of 1 or more, respectively.

$R^4$ represents a hydrogen or a polymerizable substituent group. Where $R^4$ includes a plurality of $R^4$, the plurality of $R^4$ may be the same or different from each other, but all of $R^4$ in the general formula (1-2) do not represent hydrogens.

In the general formula (1-2), it is favorable that $R^{11}$ and/or $R^{12}$ represent(s) a substituted group(s) represented by *—$Z^1$ $(R^4)_d$ (* represents a bonding site) and $R^{21}$ to $R^{26}$ and $R^{31}$ to $R^{36}$ represent hydrogens.

The chemical structural formulae of exemplified favorable monofunctional compounds of the polymerizable compound according to this embodiment are as follows.

(Chem. 12)

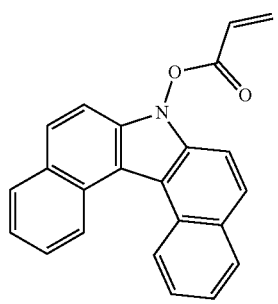

(6-1)

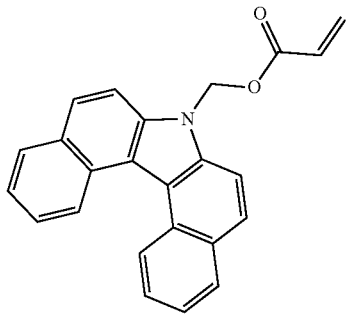

(6-2)

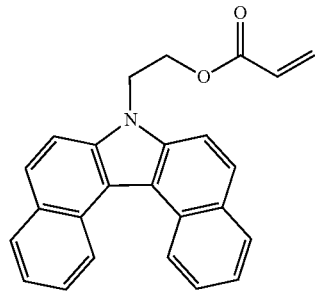

(6-3)

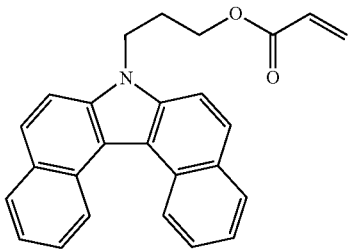

(6-4)

(Chem. 13)

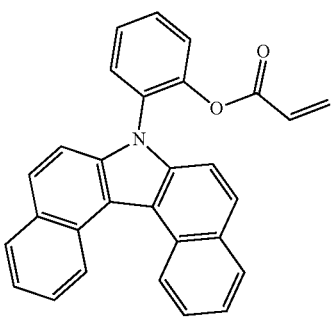

(6-5)

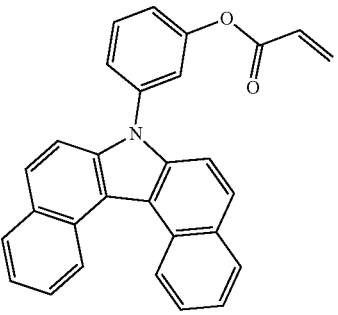

(6-6)

(6-7)
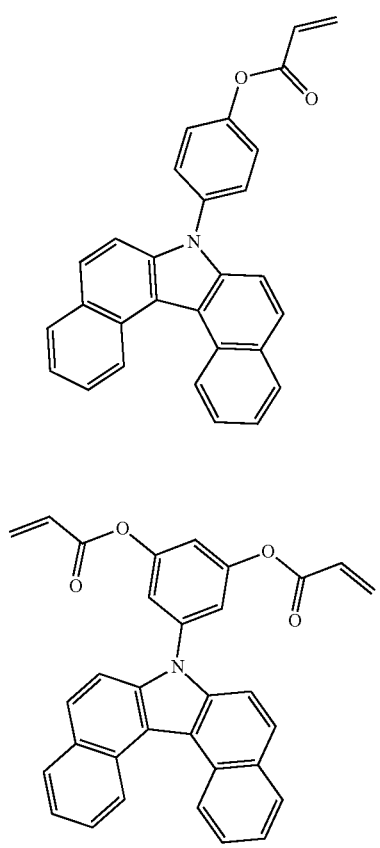
(6-8)
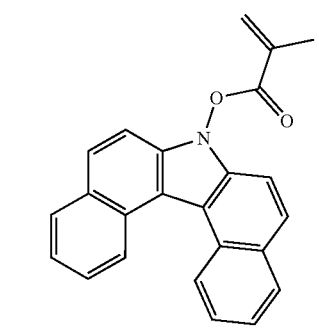
(Chem. 14)
(7-1)
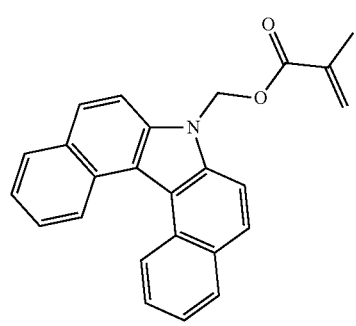
(7-2)
(7-3)
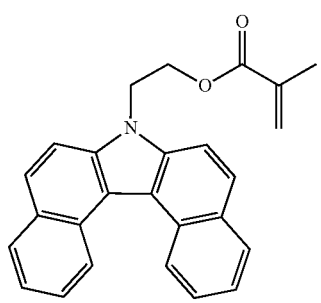
(7-4)
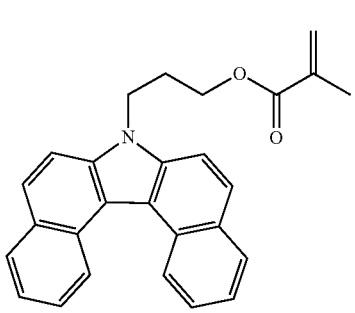
(Chem. 15)
(7-5)
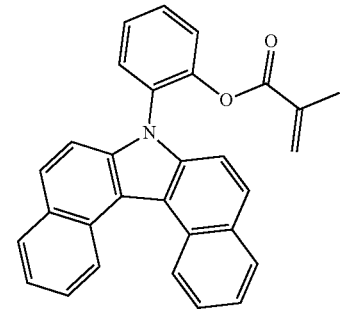
(7-6)
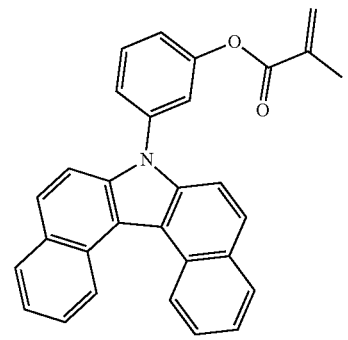

(7-7) 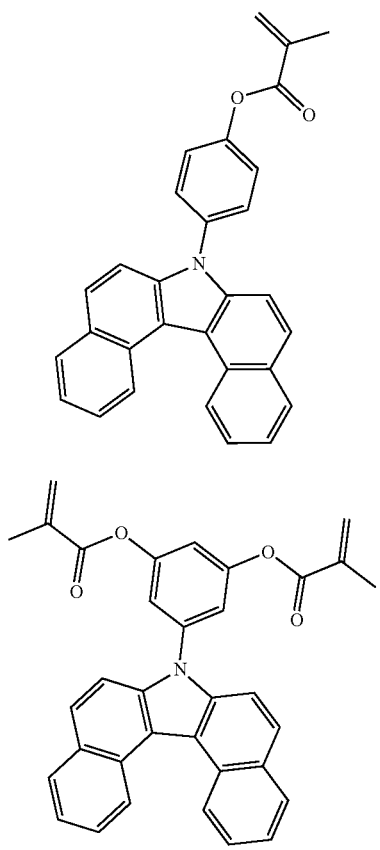
(7-8) 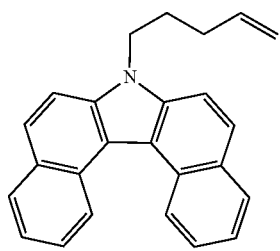
(Chem. 16)
(8-1)
(8-2)
(8-3)
(8-4) 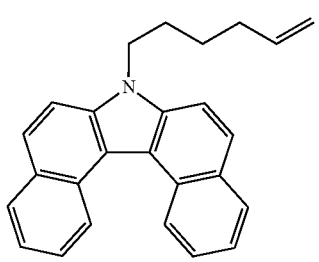
(Chem. 17)
(9-1) 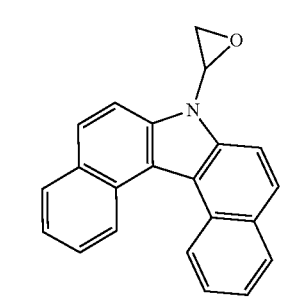
(9-2) 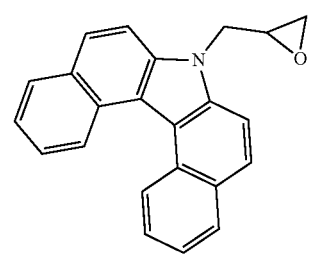
(9-3) 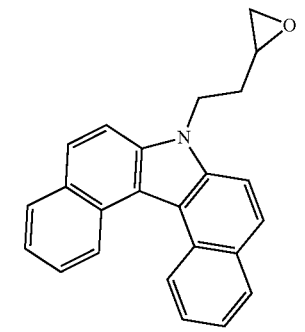
(9-4) 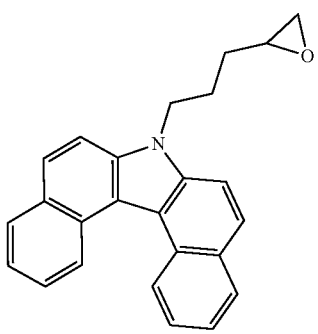

-continued
(Chem. 18)
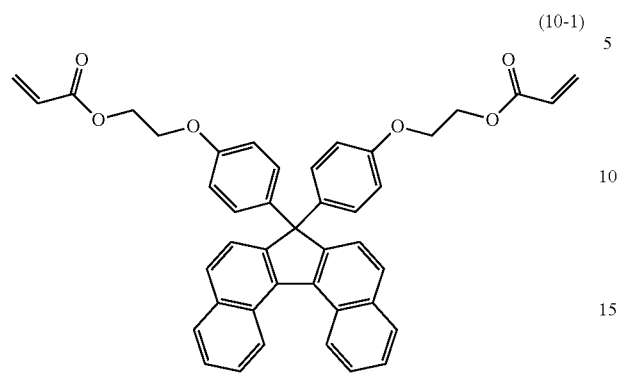
(10-1)
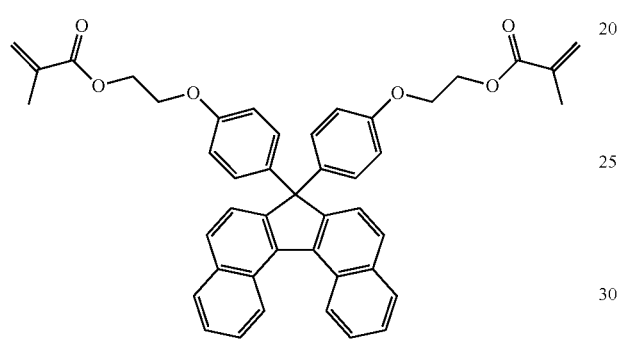
(10-2)
(Chem. 19)
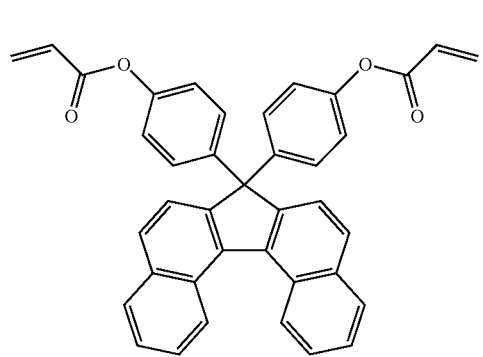
(10-3)
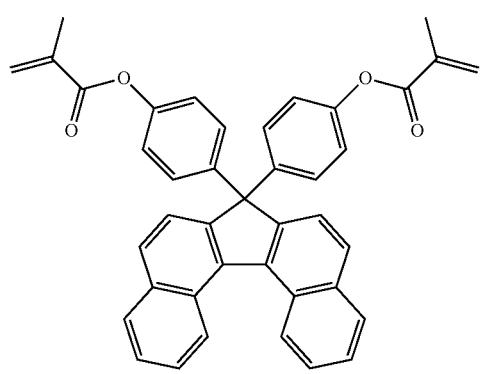
(10-4)
-continued
(Chem. 20)
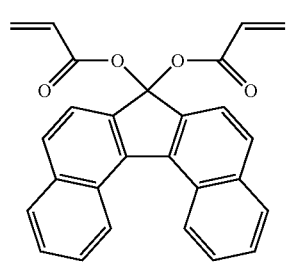
(10-5)
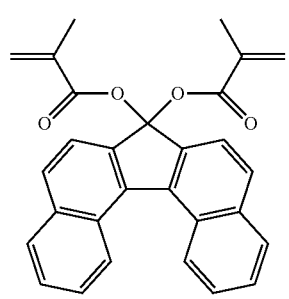
(10-6)
(Chem. 21)
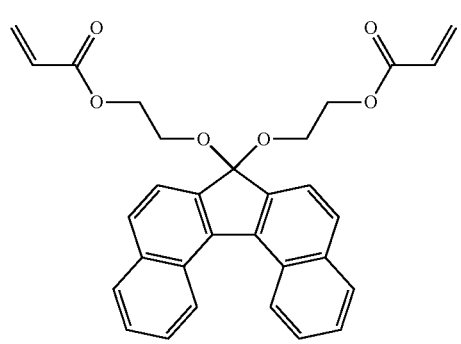
(10-7)
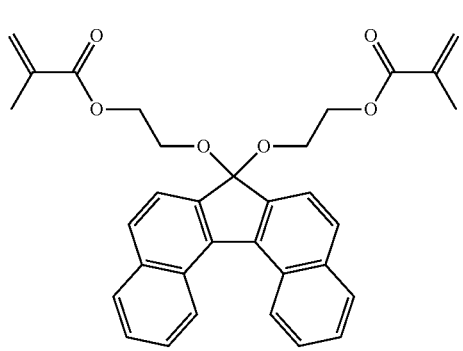
(10-8)

(Chem. 22)
(11-1)
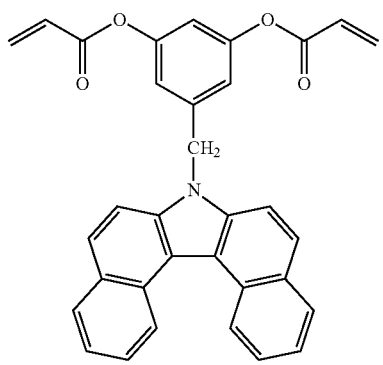
(11-2)
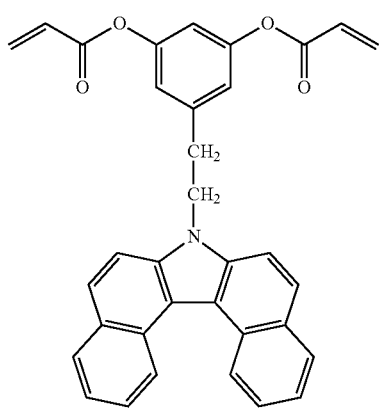
(11-3)
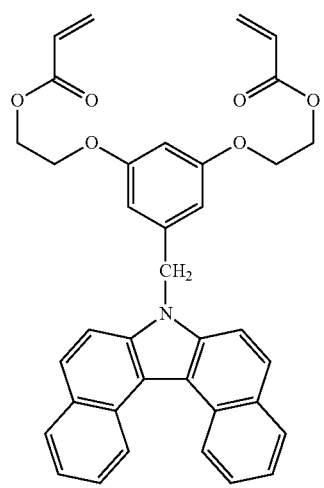
(11-4)
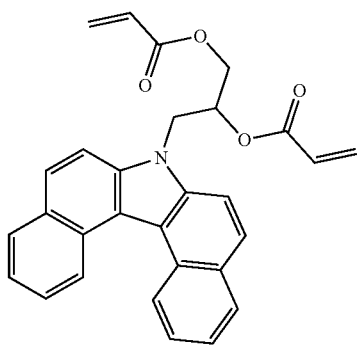
(Chem. 23)
(11-5)
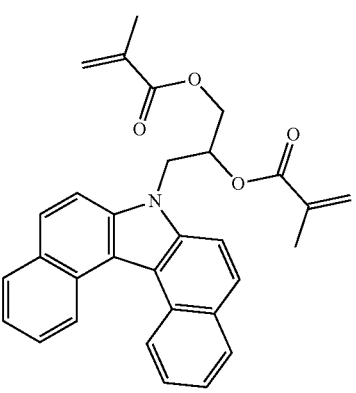
(11-6)
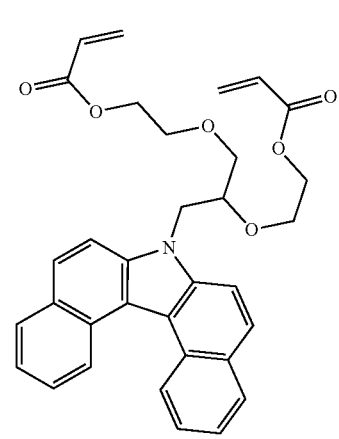
(11-7)
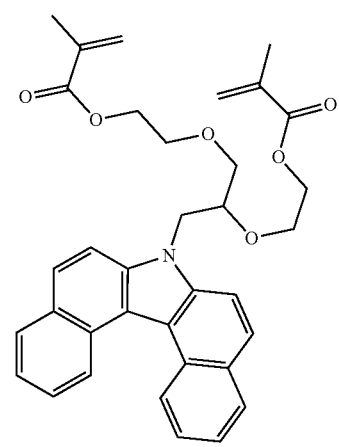
(Chem. 24)
(11-8)
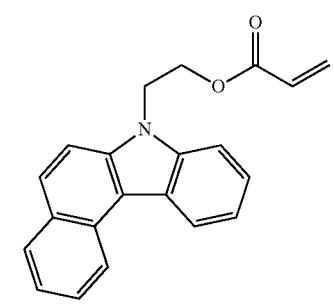

(11-9)
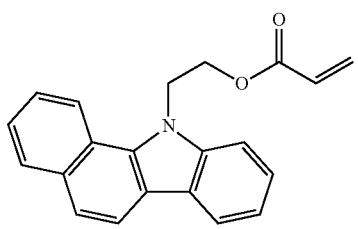

(Chem. 25)

(11-12)
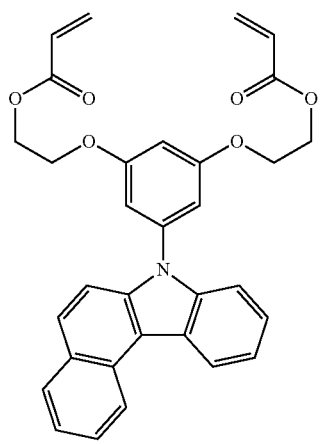

(11-10)
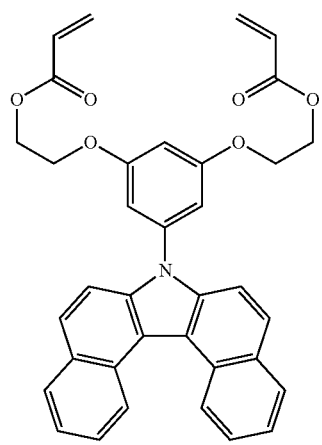

The refractive index of the polymerizable compound according to this embodiment is favorably 1.60 or more, more favorably 1.65 or more, and still more favorably 1.70 or more. Meanwhile, the refractive index of the polymerizable compound is, for example, 1.80 or less, but may exceed 1.80.

Note that the refractive index can be measured by a critical angle method or a spectroscopic ellipsometry method. For example, in the critical angle method, measurement can be performed using an Abbe refractometer ER-1 manufactured by ERMA INC (measurement wavelengths are measured in visible light areas using 486 nm, 589 nm, 656 nm, and the like).

[2-3. Binder Resin]

The photosensitive composition according to this embodiment contains a binder resin. The binder resin may be useful for improving the film strength heat resistance, and mechanical strength. The binder resin according to this embodiment is not particularly limited, and an arbitrary binder resin can be used.

Examples of the binder resin include a vinyl acetate resin such as polyvinyl acetate and a hydrolysate thereof; an acrylic resin such as poly (meth) acrylate ester and a partial hydrolysate thereof; polyvinyl alcohol or a partial acetal product thereof; triacetyl cellulose; polyisoprene; polybutadiene; polychloroprene; silicone rubber; polystyrene; polyvinyl butyral; polychloroprene; polyvinyl chloride; polyarylate; chlorinated polyethylene; chlorinated polypropylene; poly-N-vinylcarbazole or a derivative thereof; poly-N-vinylpyrrolidone or a derivative thereof; polyarylate; a copolymer of styrene and maleic anhydride or a semi-ester thereof; and a copolymer containing, as a polymerization component, at least one of a copolymerizable monomer group such as acrylic acid, acrylic acid ester, methacrylic acid, methacrylic acid ester, acrylamide, acrylonitrile, ethylene, propylene, vinyl chloride, and vinyl acetate, and one or two or more of them can be used. Further, as a copolymerization component, a monomer containing a thermosetting or photocurable curable functional group can also be used.

Further, as the binder resin, an oligomer-type curable resins can be used, Examples thereof include an epoxy compound generated by a condensation reaction of various phenol compounds such as bisphenol A, bisphenol S, (11-11)
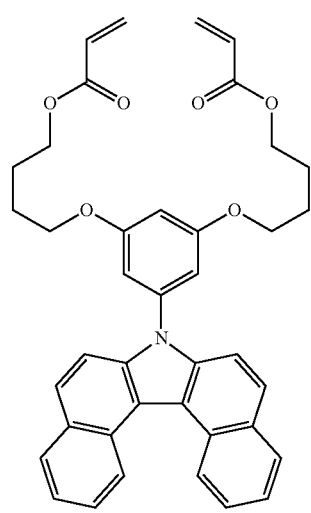

novolak, o-cresol novolak, and p-alkylphenol novolak with epichlorohydrin, and one or two or more of them can be used.

[2-4. Photoinitiator]

The photosensitive composition according to this embodiment contains a photoinitiator. The photoinitiator according to this embodiment is not particularly limited, and an arbitrary photoinitiator can be used.

Examples of the photoinitiator according to this embodiment include radical polymerization initiators (radical generators), cationic polymerization initiators (acid generators), and those having both the functions. Note that as the photoinitiator, an anionic polymerization initiator (base generator) may be used.

Examples of the radical polymerization initiator (radical generator) include an imidazole derivative, a bisimidazole derivative, an N-arylglycine derivative, an organic azide compound, an organoboron compound, titanocenes, aluminate complex, organic peroxide, N-alkoxypyridinium salt, and a thioxanthone derivative.

Specific examples thereof include, but not limited to, 1,3-di(t-butyldioxycarbonyl) benzophenone, 3,3',4,4'-tetrakis (t-butyldioxycarbonyl) benzophenone, 3-Phenyl-5-isooxazolone, 2-mercaptobenzimidazole, bis(2,4,5-triphenyl) imidazole, 2,2-dimethoxy-1,2-diphenylethane-1-one (product name: Irgacure 651, manufactured by Ciba Specialty Chemicals Co., Ltd.), 1-hydroxy-cyclohexyl-phenylketone (product name: Irgacure 184, manufactured by Ciba Specialty Chemicals Co., Ltd.), 2-benzyl-2-dimethylamino-1-(4-morpholinophenyl)-butanone-1 (product name: Irgacure 369, manufactured by Ciba Specialty Chemicals Co., Ltd.), and bis ($\eta$5-2,4-cyclopentadiene-1-yl)-bis(2,6-difluoro-3-(1H-pyrrole-1-yl)-phenyl) titanium (product name: Irgacure 784, manufactured by Ciba Specialty Chemicals Co., Ltd.).

Examples of the cationic polymerization initiator (acid generator) include sulfonic acid ester, imide sulfonate, dialkyl-4-hydroxysulfonium salt, aryl sulfonic acid-p-nitrobenzyl ester, silanol-aluminum complex, and (h6-benzene) (h5-cyclopentadienyl) iron (II).

Specific examples thereof include, but not limited to, benzointosylate, 2,5-dinitrobenzyltosylate, and N-tosylphthalate imide.

As those that can be used as the radical polymerization initiator (radical generator) and the cationic polymerization initiator (acid generator), diaryliodonium salt, diaryliodonium organoboron complex, aromatic sulfonium salt, aromatic diazonium salt, aromatic phosphonium salt, a triazine compound, and iron arene complex can be exemplified.

Specific examples thereof include, but not limited to, iodonium chloride such as 4-isopropyl-4'-methyldiphenyliodonium tetrakis (pentafluorophenyl) borate, diphenyliodonium, ditril iodonium, bis(p-tert-butylphenyl) iodonium, and bis(p-chlorophenyl) iodonium, iodonium salt such as bromid, borofylate, hexafluorophosphate salt, and hexafluoroantimonate, sulfonium chloride such as triphenylsulfonium, 4-tert-butyltriphenylsulfonium, and tris(4-methylphenyl) sulfonium, sulfonium salt such as bromid, borofylate, hexafluorophosphate salt, and hexafluoroantimonate salt, and 2,4,6-substituted-1,3,5-triazine compound such as 2,4,6-tris(trichloromethyl)-1,3,5-triazine, 2-phenyl-4,6-bis(trichloromethyl)-1,3,5-triazine, and 2-methyl-4,6-bis(trichloromethyl)-1,3,5-triazine.

[2-5. Other Components]

The photosensitive composition according to this embodiment may contain a radical polymerizable monomer, a sensitizing dye, inorganic fine particles, a plasticizer, a chain transfer agent, a polymerization inhibitor, a UV sensitizer, a solvent, and the like other than the above-mentioned compound represented by the general formula (1), in addition to the components described above.

Examples of the radical polymerizable monomer other than the compound represented by the general formula (1) include a monofunctional or polyfunctional carbazole monomer, a dinaphthothiophene monomer, a fluorene monomer, and a dibenzofuran monomer, and one or two or more of them can be used.

The sensitizing dye is capable of sensitizing the sensitivity of the photoinitiator to light. The sensitizing dye may contain either or both of a dye having absorption in a visible light area and a UV-sensitizing dye (such as an anthracene compound) to be added for the purpose of improving the photoefficiency at the time of UV irradiation. Further, only 1 kind of a sensitizing dye may be used, and a plurality of kinds of sensitizing dyes may be used to correspond to a plurality of wavelengths.

Examples of the sensitizing dye include a thiopyrylium salt dye, a merocyanine dye, a quinoline dye, a rose bengal dye, a styryl quinoline dye, a ketocumarin dye, a thioxanthene dyes, a xanthene dye, a thiazine dye, a phenazine dye, an oxonor dye, a cyanine dye, a rhodamine dye, a pyrylium salt dye, a cyclopentanone dye, and a cyclohexanone dye. Specific examples of the cyanine dye and the merocyanine dye include 3,3'-dicarboxyethyl-2,2'-thiocyanine bromide, 1-carboxymethyl-1'-carboxyethyl-2,2'-quinocyanine bromide, 1,3'-diethyl-2,2'-quinothiacyanine iodide, and 3-ethyl-5-[(3-ethyl-2(3H)-benzothiazolidine) ethylidene]-2-thioxo-4-oxazolidine. Examples of the coumarin dye and the ketocoumarin dye include 3-(2'-benzimidazole)-7-diethyl-aminocoumarin, 3,3'-carbonylbis(7-diethylaminocoumarin), 3,3'-carbonyl biscoumarin, 3,3'-carbonylbis(5,7-dimethoxycoumarin), and 3,3'-carbonylbis(7-acetoxycoumarin), and one or two or more of them can be used.

As the inorganic fine particles, for example, $TiO_2$ fine particles or $ZrO_2$ fine particles can be used. In the photosensitive composition according to this embodiment, 1 kind of inorganic fine particles may be contained, and 2 or more kinds of inorganic fine particles may be contained. For example, the $TiO_2$ fine particles and $ZrO_2$ fine particles described above may be used in combination.

The plasticizer is useful for adjusting the adhesiveness, flexibility, hardness, and other physical properties of the photosensitive composition.

Examples of the plasticizer include triethylene glycol, triethylene glycol diacetate, triethylene glycol dipropionate, triethylene glycol dicaprylate, triethylene glycol dimethyl ether, poly(ethylene glycol), poly(ethylene glycol) methyl ether, triethylene glycol bis(2-ethylhexanoate), tetraethylene glycol diheptanoate, diethyl sebacate, dibutyl suberate, tris (2-ethylhexyl) phosphate, isozolovir naphthalene, diisopropylnaphthalene, poly(propylene glycol), glyceryl tributyrate, diethyl adipic acid, diethyl sebacate, monobutyl suberate, tributyl phosphate, and tris phosphate (2-ethylhexyl), and one or two or more of them can be used.

Further, a cation polymerizable compound can be used as the plasticizer. Examples of the cation polymerizable compound include an epoxy compound and an oxetane compound. From the viewpoint of being cured after exposure and making it possible to improve the retainability of diffraction characteristics of the obtained hologram, the plasticizer according to this embodiment is favorably a cation polymerizable compound. Among them, it is more favorable to use 1 or more kinds selected from an epoxy compound and an oxetane compound.

As the epoxy compound, for example, glycidyl ether can be used. Specific examples of glycidyl ether include allyl glycidyl ether, phenylglycidyl ether, 1,4-butanediol diglycidyl ether,1,5-pentanediol diglycidyl ether, 1,6-hexanediol diglycidyl ether, 1,8-octanediol diglycidyl ether, 1,10-decanediol diglycidyl ether, 1,12-dodecanediol diglycidyl ether, ethylene glycol diglycidyl ether, diethylene glycol diglycidyl ether, polyethylene glycol diglycidyl ether, polypropylene glycol diglycidyl ether, neopentyl glycol diglycidyl ether, bisphenol A diglycidyl ether, bisphenol F diglycidyl ether, trimethylolpropane diglycidyl ether, glycerin triglycidyl ether, diglycerol triglycidyl ether, sorbitol polyglycidyl ether, and pentaerythritol polyglycidyl ether, and one or two or more of them can be used.

Examples of the oxetane compound include 3-ethyl-3-hydroxymethyloxetane, 2-ethylhexyl oxetane, xylylene bis oxetane, 3-ethyl-3{[(3-ethyloxetane-3-yl) methoxy] methyl} oxetane, 2-hydroxyethyl vinyl ether, 4-hydroxybutyl vinyl ether, diethylene glycol monovinyl ether, and 2-ethylhexyl vinyl ether, and one or two or more of them can be used.

The chain transfer agent removes radicals from the growing end of the polymerization reaction to stop the growth, and also becomes a new polymerization reaction initiating species, which can attach to the radical polymerizable monomer to initiate the growth of a new polymer. By using a chain transfer agent to increase the frequency of chain transfer of radical polymerization, the reaction rate of the radical polymerizable monomer increases, and the sensitivity to light can be improved. Further, by increasing the reaction rate of the radical polymerizable monomer and increasing the reaction contribution component, it is possible to adjust the degree of polymerization of the radical polymerizable monomer.

Examples of the chain transfer agent include α-methylstyrene dimer, 2-mercaptobenzoxazole, 2-mercaptobenzothiazole, tert-butyl alcohol, n-butanol, isobutanol, isopropylbenzene, ethylbenzene, chloroform, methyl ethyl ketone, propylene, and vinyl chloride, and one or two or more of them can be used.

Examples of the polymerization inhibitor include a quinone-based compound such as hydroquinone; a hindered phenol-based compound; a benzotriazole compound; and a thiazine-based compound such as phenothiazine, and one or two or more of them can be used.

As the UV sensitizer, for example, an anthracene compound can be used.

The solvent may be useful for improving deposition and the like in addition to viscosity control and compatibility adjustment.

Examples of the solvent include acetone, xylene, toluene, methyl ethyl ketone, tetrahydrofuran, benzene, methylene chloride, dichloromethane, chloroform, and methanol, ethanol, and one or two or more of them can be used.

[2-6. Method of Producing Photosensitive Composition]

The photosensitive composition according to this embodiment can be produced by, for example, adding the above-mentioned compound represented by the general formula (1), a binder resin, and a photoinitiator in a predetermined amount to the above-mentioned solvent at room temperature or the like, and dissolving and mixing them. Further, in accordance with the application, the purpose, or the like, a radical polymerizable monomer, a sensitizing dye, inorganic fine particles, a plasticizer, a chain transfer agent, a polymerization inhibitor, a UV sensitizer, or the like other than the above-mentioned compound represented by the general formula (1) may be added. In the case where the photosensitive composition according to this embodiment is used on the transparent base material contained in the hologram recording medium described below, the photosensitive composition may be used as a coating liquid.

3. Second Embodiment (Hologram Recording Medium)

[3-1. Hologram Recording Medium]

A hologram recording medium according to a second embodiment of the present technology is a hologram recording medium that includes a photosensitive layer containing at least the above-mentioned compound represented by the general formula (1), a binder resin, and a photoinitiator. The hologram recording medium according to this embodiment contains the photosensitive composition according to the first embodiment of the present technology.

The hologram recording medium according to this embodiment may include a photosensitive layer and at least one transparent base material, and the photosensitive layer may be formed on the at least one transparent base material.

Here, a schematic cross-sectional view of an example of the hologram recording medium according to this embodiment is shown in FIG. 1. The illustrated hologram recording medium 1 is configured to have a 3-layer structure in which a photosensitive layer 12 is disposed between a transparent protective film 11 (transparent base material) and a glass or film substrate (transparent base material) 13. As described above, the hologram recording medium according to this embodiment may be configured to have a 3-layer structure in which a photosensitive layer is formed on a first transparent base material and a second transparent base material is formed on the main surface of the photosensitive layer on which the first transparent base material is not formed.

In accordance with the hologram recording medium according to the second embodiment of the present technology, it is possible to obtain a hologram having excellent diffraction characteristics and transparency.

[3-2. Photosensitive Layer]

The photosensitive layer included in the hologram recording medium according to the second embodiment of the present technology contains at least the above-mentioned compound represented by the general formula (1), a binder resin, and a photoinitiator. The photosensitive layer contains the material of the photosensitive composition according to the first embodiment of the present technology, and all the content described for each material in 2. above also applies to the photosensitive layer of the hologram recording medium according to this embodiment. The photosensitive layer of the hologram recording medium may be formed of the photosensitive composition according to the first embodiment of the present technology and another material, or may be formed of the photosensitive composition according to the first embodiment of the present technology.

The thickness of the photosensitive layer of the hologram recording medium according to this embodiment may be appropriately set by those skilled in the art, but is favorably 0.1 to 100 μm, and more favorably 1 to 30 μm from the viewpoint of diffractive efficiency and sensitivity to light.

[3-3. Transparent Base Material]

The hologram recording medium according to the second embodiment of the present technology may contain at least one transparent base material. As the transparent base material, a glass substrate, a resin substrate having transparency, or the like may be used.

Specific examples of the resin substrate having transparency include a polyester film such as a polyethylene film, a polypropylene film, a polyethylene fluoride-based film, a polyvinylidene fluoride film, a polyvinyl chloride film, a polyvinylidene chloride film, an ethylene-vinyl alcohol film, a polyvinyl alcohol film, a polymethylmethacrylate film, a polyether sulfone film, a polycarbonate film, a cycloolefin polymer film, a polyetheretherketone film, a polyamide film, a tetrafluoroethylene-perfluoroalkyl vinyl copolymer film, and a polyethylene terephthalate film; and a polyimide film.

The thickness of a transparent base material of the hologram recording medium according to this embodiment may appropriately set by those skilled in the art, but is favorably 0.1 to 100 µm, and more favorably 1 to 30 µm from the viewpoint of the transparency and rigidity of the hologram recording medium. The film exemplified above is used as the protective film of the hologram recording medium, and a film can be laminated on a coating surface. In this case, the contact surface between the laminate film and the coating surface may be subjected to a mold release treatment so as to be easily peeled off later.

[3-4. Method of Producing Hologram Recording Medium]

The hologram recording medium according to the second embodiment of the present technology can be obtained by, for example, applying the coating liquid formed of the photosensitive composition described in 2. above on the transparent base material using a spin coater, a gravure coater, a comma coater, a bar coater, or the like and then drying them to form a photosensitive layer.

4. Third Embodiment (Hologram Optical Element)

[4-1. Hologram Optical Element]

A hologram optical element according to a third embodiment of the present technology is obtained using the hologram recording medium according to the second embodiment of the present technology. The hologram optical element according to this embodiment can be obtained by, for example, performing exposure on the hologram recording medium described above by the method described below. The hologram optical element contains at least, for example, the above-mentioned compound represented by the general formula (1), and a polymer and/or oligomer containing a constitutional unit derived from a binder resin, and a photoinitiator whose structure has been changed by generating an active species by irradiating external energy.

The hologram optical element according to the third embodiment of the present technology has a high refractive index modulation amount (Δn) and exhibits excellent diffraction characteristics. Further, the hologram optical element according to this embodiment is excellent in transparency.

[4-2. Method of Producing Hologram Optical Element]

The hologram optical element according to the third embodiment of the present technology can be obtained by, for example, performing two-beam exposure on the hologram recording medium according to the second embodiment of the present technology by using a semiconductor laser in a visible light area and then irradiating the entire surface with UV (ultraviolet rays) to cure the uncured monomers or the like, and fixing the refractive index distribution to the hologram recording medium. The conditions of the two-beam exposure may be appropriately set by those skilled in the art in accordance with the application, the purpose, and the like of the hologram optical element. However, it is desirable to perform interferometric exposure by setting the light intensity of one beam on the hologram recording medium to 0.1 to 100 mW/cm$^2$ for 1 to 1000 seconds so that the angle between the two beams is 0.1 to 179.9 degrees.

5. Fourth Embodiment (Optical Apparatus and Optical Part)

An optical apparatus and an optical part according to a fourth embodiment of the present technology are those using the hologram optical element according to the third embodiment of the present technology.

Examples of the optical apparatus and the optical part include an image display apparatus such as eyewear, a holographic screen, a transparent display, a head-mounted display, and a head-up display, an imaging apparatus, an image sensor, a color filter, a diffraction lens, a light guide plate, a spectroscopic element, a hologram sheet, an information recording medium such as an optical disc and a magneto-optical disc, an optical pick-up device, a polarization microscope, and a sensor.

The optical apparatus and optical part according to the fourth embodiment of the present technology each use a hologram optical element that is excellent in diffraction characteristics and transparency. For this reason, it is possible to realize an optical apparatus and an optical part having high optical properties and optical stability. Further, when the present technology is used for a display, a display having high see-through property can be obtained.

6. Fifth Embodiment (Method of Forming Hologram Diffraction Grating)

The present technology provides a method of forming a hologram diffraction grating, including causing a hologram recording medium that includes a photosensitive layer containing at least a polymerizable compound containing the above-mentioned compound represented by the general formula (1), a binder resin, and a photoinitiator to react by electromagnetic radiation whose amplitude intensity has been spatially modulated. The method of forming a hologram diffraction grating is the interferometric exposure described in 4-2. above. For this reason, description of the method of forming a hologram diffraction grating is omitted. In accordance with the method of forming a hologram diffraction grating, the effects as described in 4. above are exhibited.

It should be noted that the embodiment according to the present technology is not limited to the embodiment described above, and various modifications can be made without departing from the essence of the present technology.

Further, the effects described herein are not limitative but are merely illustrative, and other effects may be provided.

Note that the present technology may also take the following configurations.

[1] A photosensitive composition, including at least:

a compound represented by the following general formula (1);

a binder resin; and a photoinitiator.

(Chem. 26)

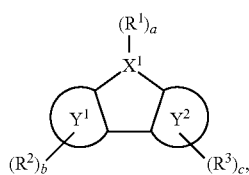

(1)

In the general formula (1), $X^1$ represents an oxygen atom, a nitrogen atom, a phosphorus atom, a caron atom, or a silicon atom. Where $X^1$ represents an oxygen atom, where $X^1$ represents a nitrogen atom or a phosphorus atom, and where $X^1$ represents a caron atom or a silicon atom, a represents 0, a represents 1, and a represents 2, respectively.

$Y^1$ and $Y^2$ each represent a benzene ring or a naphthalene ring, and both $Y^1$ and $Y^2$ do not represent benzene rings. Where $Y^1$ or $Y^2$ represents a benzene ring, b or c corresponding to $Y^1$ or $Y^2$ that is the benzene ring represents 4. Where $Y^1$ and/or $Y^2$ represent(s) a naphthalene ring(s), b and/or c corresponding to $Y^1$ and/or $Y^2$ that is(are) the naphthalene ring(s) represent(s) 6.

$R^1$ to $R^3$ each represent a hydrogen or a substituent group represented by *—$Z^1(R^4)_d$ (* represents a bonding site). Where $R^1$ to $R^3$ respectively include a plurality of $R^1$, a plurality of $R^2$, and a plurality of $R^3$, the plurality of $R^1$ to $R^3$ may be the same or different from each other, but all of $R^1$ to $R^3$ in the general formula (1) do not represent hydrogens.

$Z^1$ represents a single bond, a saturated hydrocarbon group having a valence of 2 or higher, or an unsaturated hydrocarbon group having a valence of 2 or higher, and the saturated hydrocarbon group or the unsaturated hydrocarbon group may have an ether bond and/or a thioether bond. Where $Z^1$ represents a single bond and where $Z^1$ represents a saturated hydrocarbon group or an unsaturated hydrocarbon group, d represents 1 and d represents an integer of 1 or more, respectively.

$R^4$ represents a hydrogen or a polymerizable substituent group. Where $R^4$ includes a plurality of $R^4$, the plurality of $R^4$ may be the same or different from each other but all $R^4$ in the general formula (1) do not represent hydrogens.

[2] The photosensitive composition according to [1], in which
the photosensitive composition contains a compound in which $X^1$ in the general formula (1) represents a nitrogen atom.

[3] The photosensitive composition according to [1] or [2], in which
the compound is a compound represented by the following general formula (1-1).

(Chem. 27)

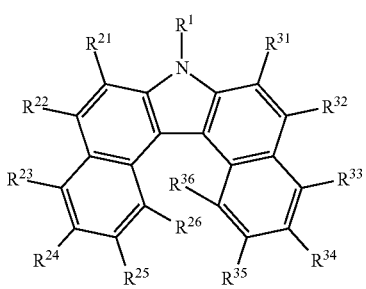

(1-1)

In the general formula (1-1), $R^1$, $R^{21}$ to $R^{26}$, and $R^{31}$ to $R^{36}$ each represent a hydrogen or a substituent group represented by *—$Z^1(R^4)_d$ (* represents a bonding site). $R^1$, $R^{21}$ to $R^{26}$, and $R^{31}$ to $R^{36}$ may be the same or different from each other. However, all of $R^1$, $R^{21}$ to $R^{26}$, and $R^{31}$ to $R^{36}$ in the general formula (1-1) do not represent hydrogens.

$Z^1$ represents a single bond, a saturated hydrocarbon group having a valence of 2 or higher, or an unsaturated hydrocarbon group having a valence of 2 or higher, and the saturated hydrocarbon group or the unsaturated hydrocarbon group may have an ether bond and/or a thioether bond. Where $Z^1$ represents a single bond and where $Z^1$ represents a saturated hydrocarbon group or an unsaturated hydrocarbon group, d represents 1 and d represents an integer of 1 or more, respectively.

$R^4$ represents a hydrogen or a polymerizable substituent group. Where $R^4$ includes a plurality of $R^4$, the plurality of $R^4$ may be the same or different from each other but all $R^4$ in the general formula (1-1) do not represent hydrogens.

[4] The photosensitive composition according to [1], in which
the photosensitive composition contains a compound in which $X^1$ in the general formula (1) represents a carbon atom.

[5] The photosensitive composition according to [1] or [4], in which
the compound is a compound represented by the following general formula (1-2).

(Chem. 28)

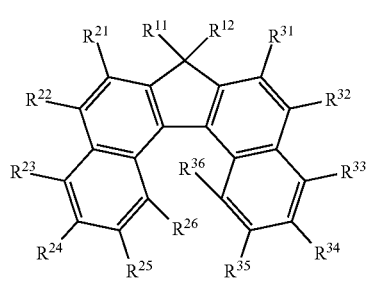

(1-2)

In the general formula (1-2), $R^{11}$, $R^{12}$, $R^{21}$ to $R^{26}$, and $R^{31}$ to $R^{36}$ each represent a hydrogen or a substituted group represented by *—$Z^1(R^4)_d$ (* represents a bonding site). $R^{11}$, $R^{12}$, $R^{21}$ to $R^{26}$, and $R^{31}$ to $R^{36}$ may be the same or different from each other. However, all of $R^{11}$, $R^{12}$, $R^{21}$ to $R^{26}$, and $R^{31}$ to $R^{36}$ in the general formula (1-2) do not represent hydrogens.

$Z^1$ represents a single bond, a saturated hydrocarbon group having a valence of 2 or higher, or an unsaturated hydrocarbon group having a valence of 2 or higher, and the saturated hydrocarbon group or the unsaturated hydrocarbon group may have an ether bond and/or a thioether bond. Where $Z^1$ represents a single bond and where $Z^1$ represents a saturated hydrocarbon group or an unsaturated hydrocarbon group, d represents 1 and d represents an integer of 1 or more, respectively.

$R^4$ represents a hydrogen or a polymerizable substituent group. Where $R^4$ includes a plurality of $R^4$, the plurality of $R^4$ may be the same or different from each other, but all of $R^4$ in the general formula (1-2) do not represent hydrogens.

[6] A hologram recording medium using the photosensitive composition according to any one of [1] to [5].

[7] A hologram optical element using the hologram recording medium according to [6].
[8] An optical apparatus using the hologram optical element according to [7].
[9] An optical element using the hologram optical element according to [7].
[10] An image display apparatus using the hologram optical element according to [7].
[11] A method of forming a hologram diffraction grating, including:
causing a hologram recording medium that includes a photosensitive layer containing at least a polymerizable compound containing a compound represented by the following general formula (1), a binder resin, and a photoinitiator to react by electromagnetic radiation whose amplitude intensity has been spatially modulated.

(Chem. 29)

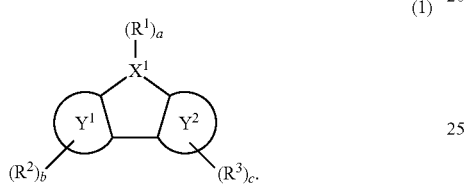

(1)

In the general formula (1), $X^1$ represents an oxygen atom, a nitrogen atom, a phosphorus atom, a caron atom, or a silicon atom. Where $X^1$ represents an oxygen atom, where $X^1$ represents a nitrogen atom or a phosphorus atom, and where $X^1$ represents a caron atom or a silicon atom, a represents 0, a represents 1, and a represents 2, respectively.

$Y^1$ and $Y^2$ each represent a benzene ring or a naphthalene ring, and both $Y^1$ and $Y^2$ do not represent benzene rings. Where $Y^1$ or $Y^2$ represents a benzene ring, b or c corresponding to $Y^1$ or $Y^2$ that is the benzene ring represents 4. Where $Y^1$ and/or $Y^2$ represent(s) a naphthalene ring(s), b and/or c corresponding to $Y^1$ and/or $Y^2$ that is(are) the naphthalene ring(s) represent(s) 6.

$R^1$ to $R^3$ each represent a hydrogen or a substituent group represented by $*-Z^1(R^4)_d$ (* represents a bonding site). Where $R^1$ to $R^3$ respectively include a plurality of $R^1$, a plurality of $R^2$, and a plurality of $R^3$, the plurality of $R^1$ to $R^3$ may be the same or different from each other, but all of $R^1$ to $R^3$ in the general formula (1) do not represent hydrogens.

$Z^1$ represents a single bond, a saturated hydrocarbon group having a valence of 2 or higher, or an unsaturated hydrocarbon group having a valence of 2 or higher, and the saturated hydrocarbon group or the unsaturated hydrocarbon group may have an ether bond and/or a thioether bond. Where $Z^1$ represents a single bond and where $Z^1$ represents a saturated hydrocarbon group or an unsaturated hydrocarbon group, d represents 1 and d represents an integer of 1 or more, respectively.

$R^4$ represents a hydrogen or a polymerizable substituent group. Where $R^4$ includes a plurality of $R^4$, the plurality of $R^4$ may be the same or different from each other but all $R^4$ in the general formula (1) do not represent hydrogens.

EXAMPLE

The effects of the present technology will be specifically described with reference to Examples. Note that the scope of the present technology is not limited to the Examples.

Test Example 1

[Preparation of Compound Represented by Chemical Formula (6-3)]

A compound represented by the following chemical formula (6-3) was synthesized, and the compound represented by the following chemical formula (6-3) was used as a compound of Test Example 1.

(Chem. 30)

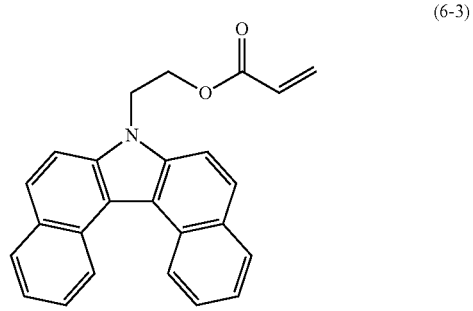 [SMILES: C=CC(=O)OCCn1c2ccc3ccccc3c2c2c3ccccc3ccc21]

(6-3)

[Method of Synthesizing Compound Represented by Chemical Formula (6-3)]

A method of synthesizing (synthesis route of) the compound represented by the chemical formula (6-3) is as follows.

(Chem.31)

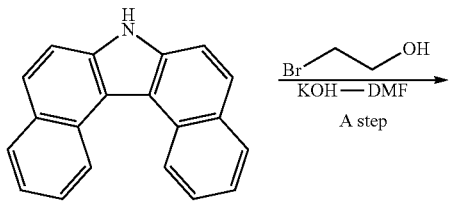

Compound 1

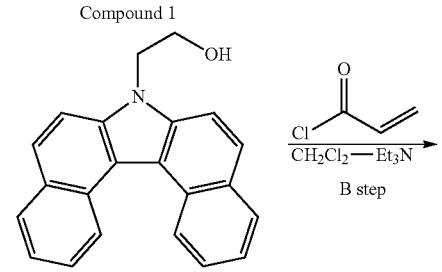

Intermediate 1

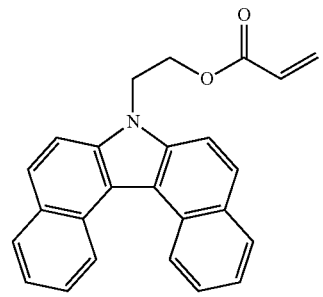

(6-3)

(A Step)

An A step of the synthesis route described above will be described.

110 mL of a solution of N,N-dimethylformamide (manufactured by Kanto Chemical Co., Ltd.) mixed with 20 g of potassium hydroxide (manufactured by Kanto Chemical Co., Ltd.) was prepared in an inert atmosphere, 15 g of a compound 1 (7H-dibenzo [c, g] carbazole (manufactured by Tokyo Chemical Industry Co., Ltd.)) was added thereto, the mixture was stirred for 1 hour, and then 25 g of 2-bromoethanol (manufactured by Tokyo Chemical Industry Co., Ltd.) was added thereto and reacted for 20 hours. Water was added thereto for quenching, extraction was performed on the mixture with toluene using a separatory funnel, and column purification was performed to obtain 10 g of a target product (intermediate 1).

(B Step)

A B step of the synthesis route described above will be described.

9 g of the intermediate 1 was dissolved in a solution obtained by mixing 6 mL of triethylamine (manufactured by Kanto Chemical Co., Ltd.) in 50 mL of methylene chloride (manufactured by Kanto Chemical Co., Ltd.), and the mixture was cooled in an ice bath. After that, 3 mL of acrylic chloride (manufactured by Tokyo Chemical Industry Co., Ltd.) was added in portions, and the mixture was brought to room temperature at a natural temperature rise and reacted for 4 hours. Water was added thereto for quenching, and extraction was performed on the mixture with methylene chloride (manufactured by Kanto Chemical Co., Ltd.) using a separatory funnel. The organic layer was cleaned with saline, silica filtration was performed, and then, column purification was performed to obtain 6 g of a compound according to Test Example 1 (the compound represented by the chemical formula (6-3)).

NMR was used to identify the structure of the compound according to Test Example 1 (the compound represented by the chemical formula (6-3)). The NMR results are as follows.

1H NMR (CDCl$_3$): 4.60-4.64 (2H), 4.85-4.89 (2H), 5.74-5.76 (1H), 5.95-6.05 (1H), 6.25-6.31 (1H), 7.49-7.55 (2H), 7.65-7.69 (2H), 7.70-7.77 (2H), 7.91-7.94 (2H), 8.03-8.06 (2H), 9.18-9.22 (2H)

Test Example 2

[Preparation of Compound Represented by Chemical Formula (6-8)]

A compound represented by the following chemical formula (6-8) was synthesized, and the compound represented by the following chemical formula (6-8) was used as a compound according to Test Example 2.

(Chem. 30)

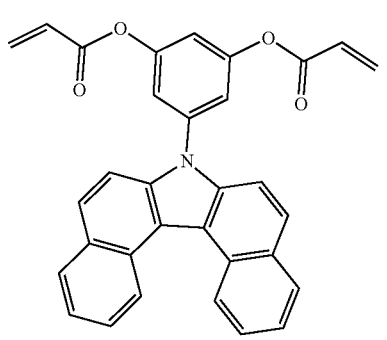

(6-8)

[Method of Synthesizing Compound Represented by Chemical Formula (6-8)]

The method of synthesizing (synthesis route of) the compound represented by the chemical formula (6-8) is as follows.

(Chem. 33)

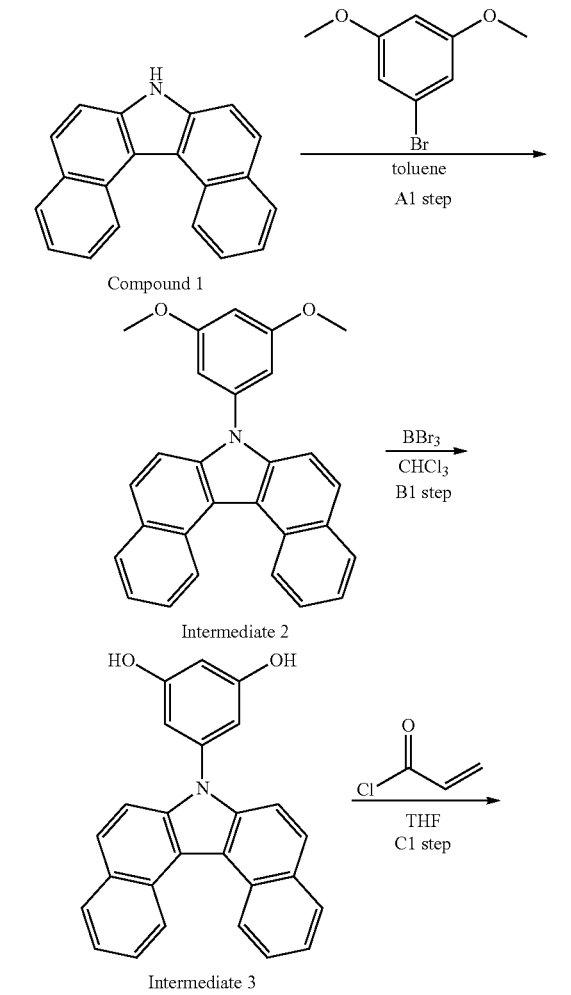

(A1 Step)

An A1 step of the synthesis route described above will be described.

300 mL of a toluene (manufactured by Kanto Chemical Co., Ltd.) solution of 24 g of 1-bromo-3,5-dimethoxybenzene (manufactured by Tokyo Chemical Industry Co., Ltd.), 36 g of tripotassium phosphate (manufactured by Kanto Chemical Co., Ltd.), and 15 g of the compound 1 (7H-dibenzo [c, g] carbazole (manufactured by Tokyo Chemical Industry Co., Ltd.)) was prepared in an inert atmosphere, 25 mL of 1,2-cyclohexanediamine (manufactured by Tokyo Chemical Industry Co., Ltd.) and 20 g of copper iodide (manufactured by Fujifilm Wako Pure Chemical Industries, Ltd.) were added thereto, and the mixture was reacted at heating reflux to obtain 10 g of an intermediate 2.

(B1 Step)

A B1 step of the synthesis route described above will be described.

9 g of the intermediate 2 was dissolved in 125 mL of chloroform (manufactured by Kanto Chemical Co., Ltd.), the mixture was cooled with ice water, and then, 100 mL of a dichloromethane solution (concentration of 1 mol/L) in which boron tribromide was dissolved was added dropwise, stirred under ice cooling, and then reacted at room temperature for 4 hour. Ice water was added thereto for quenching, heptane (manufactured by Kanto Chemical Co., Ltd.) was added thereto, and the mixture was recrystallized in a refrigerator to obtain 8 g of an intermediate 3.

(C1 Step)

A C1 step of the synthesis route described above will be described.

5 g of the intermediate 3 was dissolved in a solution obtained mixing 50 mL of tetrahydrofuran (manufactured by Kanto Chemical Co., Ltd.), 8.5 mL of triethylamine (manufactured by Kanto Chemical Co., Ltd.), and 30 mg of butylhydroxytoluene (manufactured by Tokyo Chemical Industry Co., Ltd.). After that, 3.5 mL of acrylic chloride (manufactured by Tokyo Chemical Industry Co., Ltd.) was added in portions, the mixture was reacted at room temperature for 30 minutes, and then water was added thereto for quenching to obtain 3.5 g of a compound according to Test Example 2 (the compound represented by the chemical formula (6-8)) by filtration treatment and column purification.

NMR was used to identify the structure of the compound according to Test Example 2 (the compound represented by the chemical formula (6-8)). The NMR results are as follows.

1H NMR (CDCl$_3$): 6.05-6.08 (2H), 6.29-6.39 (2H), 6.63-6.69 (2H), 7.25-7.27 (1H), 7.35-7.36 (2H), 7.53-7.54 (2H), 7.69-7.72 (4H), 7.86-7.90 (2H), 8.03-8.06 (2H), 9.21-9.24 (2H)

Test Example 3

A compound represented by the following chemical formula (11-3) was synthesized, and the compound represented by the following chemical formula (11-3) was used as a compound according to Test Example 3.

(Chem. 34)

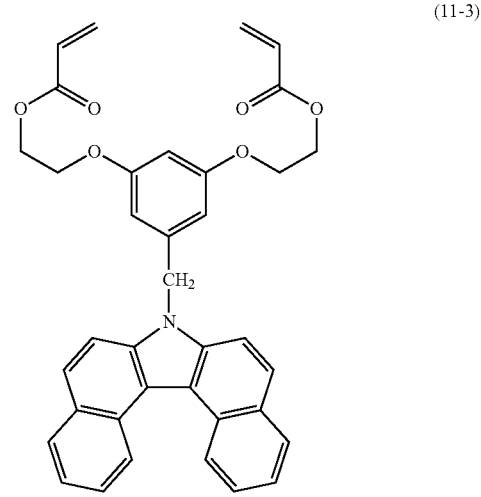

(11-3)

[Method of Synthesizing Compound Represented by Chemical Formula (11-3)]

The method of synthesizing (synthesis route of) the compound represented by the chemical formula (11-3) is as follows.

(Chem. 35)

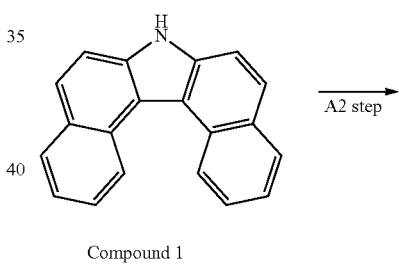

Compound 1

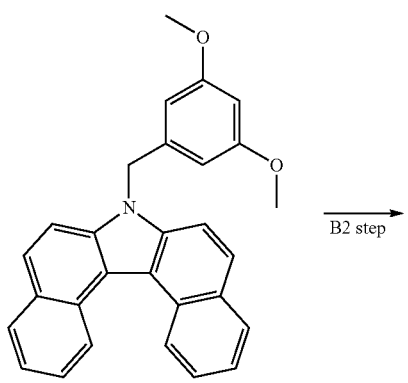

Intermediate 4

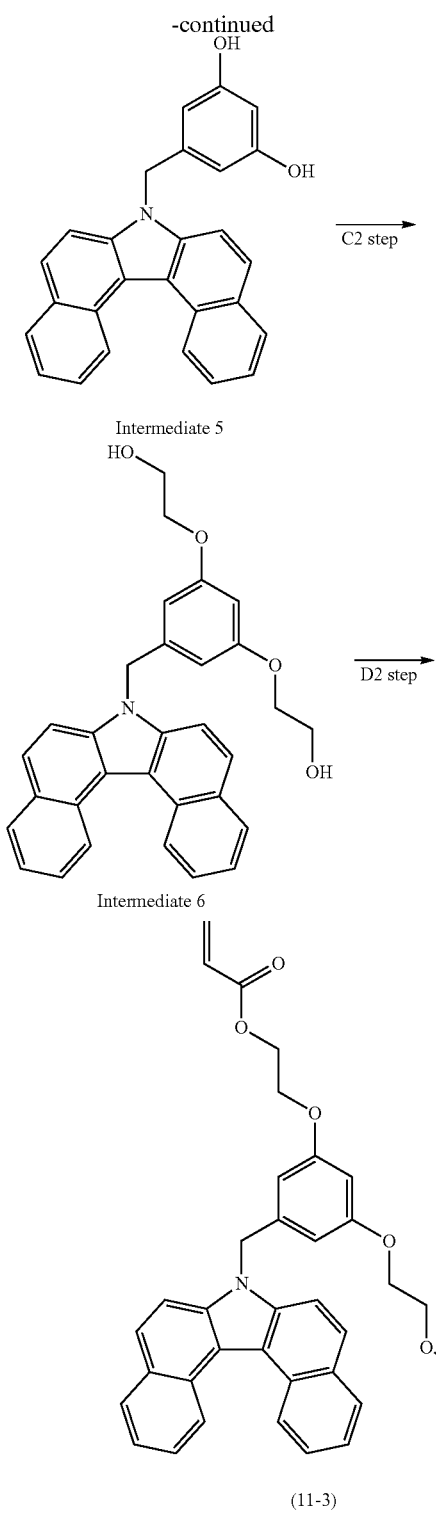

Intermediate 5

Intermediate 6

(11-3)

(A2 Step)

An A2 step of the synthesis route described above will be described.

45 g of the compound 1 (7H-dibenzo [c,g] carbazole (manufactured by Tokyo Chemical Industry Co., Ltd.)) and 51 g of potassium carbonate (manufactured by Tokyo Chemical Industry Co., Ltd.) were dissolved in 680 mL of dehydrated N,N-dimethylformamide (manufactured by Fujifilm Wako Pure Chemical Industries, Ltd.) in an inert atmosphere, and then 62 g of 3,5-dimethoxybenzyl bromide (manufactured by Tokyo Chemical Industry Co., Ltd.) was added thereto and reacted to obtain 63 g of a target product (intermediate 4).

(B2 Step)

A B2 step of the synthesis route described above will be described.

55 g of the intermediate 4 was dissolved in 1.4 L of dehydrated dichloromethane (manufactured by Fujifilm Wako Pure Chemical Industries, Ltd.) in an inert atmosphere, the mixture was cooled with ice water, 490 mL of a boron tribromide-dichloromethane solution (concentration of 1 mol/L, manufactured by Fujifilm Wako Pure Chemical Industries, Ltd.) was added dropwise, and the mixture was stirred for 4 hours. Ice water was added thereto for quenching, heptane (manufactured by Kanto Chemical Co., Ltd.) was added thereto, the mixture was recrystallized in a refrigerator, chloroform was added thereto, an organic layer was extracted, and then, column purification was performed on the precipitated solid obtained by concentration under reduced pressure or the like to obtain 43 g of a target product (intermediate 5).

(C2 Step)

A C2 step of the synthesis route described above will be described.

360 mL of a sodium hydroxide aqueous solution (concentration of 8.0 mol/L, manufactured by Fujifilm Wako Pure Chemical Industries, Ltd.), 13 g of tetrabutylammonium bromide (manufactured by Tokyo Chemical Industry Co., Ltd.), and 40 g of the target product 5 were mixed in an inert atmosphere and cooled with ice water, and then 70 mL of 2-(2-chloroethoxy)tetrahydro-2H-pyran (manufactured by Tokyo Chemical Industry Co., Ltd.) was added dropwise. The ice water was removed, and the mixture was stirred for 2 hours while being heated to 80° C. Water was used for quenching, and chloroform was used to perform extraction. 140 g of an orange oil was obtained from the obtained organic layer. 400 mL of dichloromethane (manufactured by Tokyo Chemical Industry Co., Ltd.), 400 mL of methanol (manufactured by Tokyo Chemical Industry Co., Ltd.), and 8.0 mL of concentrated hydrochloric acid (manufactured by Tokyo Chemical Industry Co., Ltd.) were added thereto, the mixture was stirred at room temperature, and then, methanol was added to the reaction solution to produce a precipitate and obtain 37 g of a white solid. This was dissolved in 2.1 L of tetrahydrofuran (manufactured by Tokyo Chemical Industry Co., Ltd.) and concentrated under reduced pressure, and then heptane was added to the residue and the precipitated crystal was filtered. Further, the obtained product was dried under reduced pressure to obtain 35 g of a target product (intermediate 6).

(D2 Step)

A D2 step of the synthesis route described above will be described.

450 mL of dehydrated tetrahydrofuran (manufactured by Tokyo Chemical Industry Co., Ltd.), 1.6 g of 4-dimethylamino pyridine (manufactured by Tokyo Chemical Industry Co., Ltd.), 11 mL of acrylic acid, and 30 g of the intermediate 6 were mixed in an inert atmosphere, 1.8 mL of N,N'-diisopropylcarbodiimide (manufactured by Fujifilm Wako Pure Chemical Industries, Ltd.) was added dropwise while being cooled with ice water. The ice water was removed, the mixture was stirred at room temperature, and then, Celite filtration was performed, and the filtrate was concentrated under reduced pressure to obtain 65 g of a pale yellow oil. The obtained oil, 380 mL of dehydrated tetrahydrofuran (manufactured by Fujifilm Wako Pure Chemical Industries, Ltd.), 2.1 g of 4-dimethylamino pyridine (manufactured by Tokyo Chemical Industry Co., Ltd.), and 13 mL of acrylic acid (manufactured by Tokyo Chemical Industry Co., Ltd.) were mixed, and 35 mL of N,N'-diisopropylcarbodiimide was added dropwise while being cooled with ice water. The ice water was removed, the mixture was stirred at room temperature, and then, the mixture was concentrated under reduced pressure, and chloroform and water were added to the residue and separated. After obtaining a yellow oil from an organic layer obtained by the separation, a material solidified by performing column purification and cooling was slurried with a mixed solvent of heptane/ethyl acetate (manufactured by Tokyo Chemical Industry Co., Ltd.) and filtered. The crystal was cleaned with 380 mL of a heptane/ethyl acetate mixed solvent, the resulting white solid was dissolved in chloroform, and 10 mL of a 0.04 mg/mL phenothiazine-chloroform solution was added thereto. After that, the obtained product was concentrated to dryness to obtain a compound according to Test Example 3 (the compound represented by the chemical formula (11-3)).

NMR was used to identify the structure of the compound according to Test Example 3 (the compound represented by the chemical formula (11-3)). The NMR results are as follows.

1H NMR (CDCl$_3$): 4.00-4.04 (4H), 4.36-4.39 (4H), 5.68-5.70 (2H), 5.77-5.81 (2H), 6.03-6.12 (2H), 6.29-6.41 (5H), 7.53-7.55 (2H), 7.64-7.70 (4H), 7.87-7.89 (2H), 8.02-8.05 (2H), 9.22-9.26 (2H)

Test Example 4

A compound represented by the following chemical formula (11-10) was synthesized, and the compound represented by the following chemical formula (11-10) was used as a compound according to Test Example 4.

(Chem. 36)

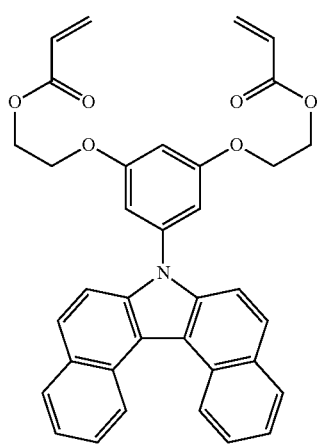

(11-10)

[Method of Synthesizing Compound Represented by the Chemical Formula (11-10)]

The method of synthesizing (synthesis route of) the compound represented by the chemical formula (11-10) is as follows.

(Chem. 37)

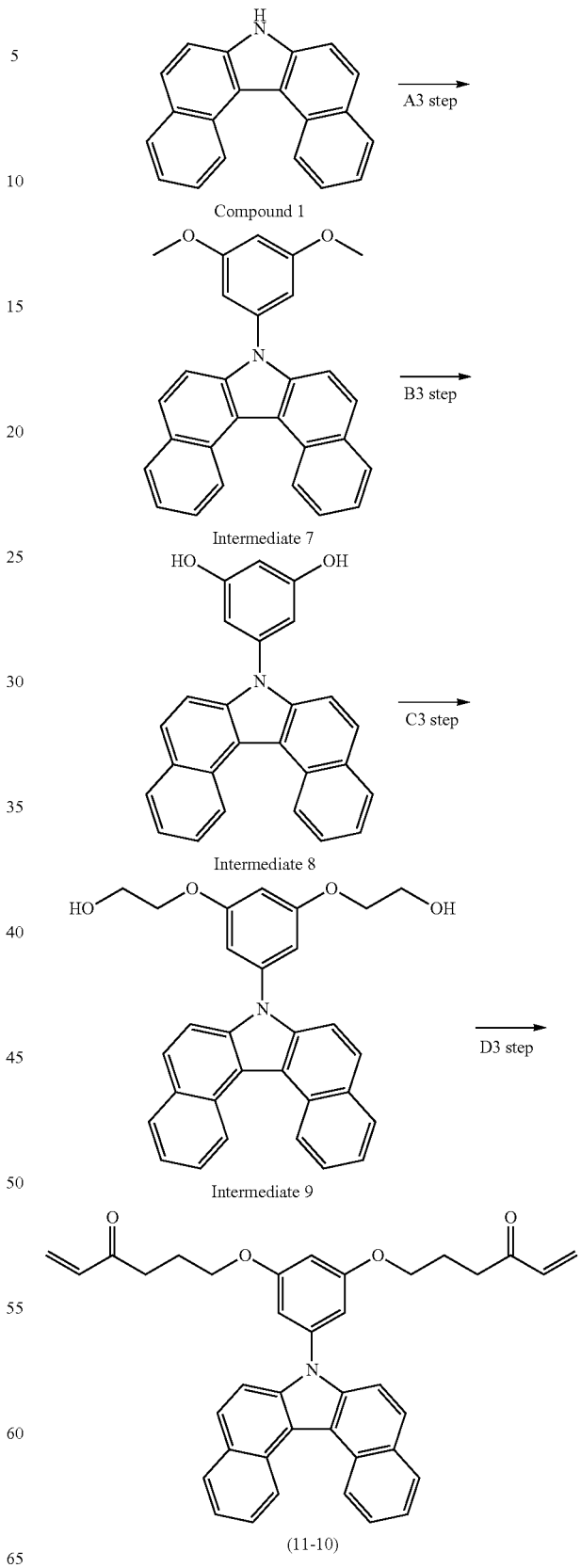

(A3 Sep)

An A3 step of the synthesis route described above will be described.

90 g of the compound 1 (7H-dibenzo [c, g] carbazole (manufactured by Tokyo Chemical Industry Co., Ltd.)), 146 g of 1-bromo-3,5-dimethoxybenzene (manufactured by Tokyo Chemical Industry Co., Ltd.), 214 g of tripotassium phosphate (manufactured by Fujifilm Wako Pure Chemical Industries, Ltd.) were dissolved in 1.8 L of deoxidized toluene (manufactured by Fujifilm Wako Pure Chemical Industries, Ltd.) in an inert atmosphere, and then 80 mL of 1,2-cyclohexanediamine (manufactured by Tokyo Chemical Industry Co., Ltd.) and 64 g of copper iodide(I) (manufactured by Fujifilm Wako Pure Chemical Industries, Ltd.) were added thereto and stirred at heating reflux for 2 days. The mixture was allowed to cool to room temperature, the reaction solution was filtered, 141 g of Si-Thiol (manufactured by Biotage Japan Ltd.) was added to the filtrate, the mixture was stirred for 30 minutes, and then, Si-Thiol was removed by filtration to obtain 63 g of a target product (intermediate 7).

(B3 Sep)

A B3 step of the synthesis route described above will be described.

62 g of the intermediate 7 was dissolved in 870 mL of super dehydrated chloroform (amylene additive, manufactured by Fujifilm Wako Pure Chemical Industries, Ltd.) in an inert atmosphere, 700 mL of an ice-cooled boron tribromide-dichloromethane solution (concentration of 1.0 mol/L, manufactured by Fujifilm Wako Pure Chemical Industries, Ltd.) was added dropwise, the mixture was stirred under ice cooling for 2.5 hours, and then, the mixture was returned to room temperature and stirred for another 2.5 hours. After further ice cooling, 200 mL of a boron tribromide-dichloromethane solution (concentration of 1.0 mol/L) was added dropwise, the mixture was heated to room temperature and stirred, the reaction solution was poured into ice water for quenching, the mixture was cleaned with chloroform and recrystallized in a refrigerator, and filtration and then column purification were performed to obtain 60 g of a target product (intermediate 8).

(C3 Step)

A C3 step of the synthesis route described above will be described.

230 mL of a sodium hydroxide aqueous solution (concentration of 8.0 mol/L, manufactured by Fujifilm Wako Pure Chemical Industries, Ltd.), 8.5 g of tetrabutylammonium bromide (manufactured by Tokyo Chemical Industry Co., Ltd.), and 25 g of the intermediate 8 were mixed in an inert atmosphere and cooled in ice water, and then, 46 mL of 2-(2-chloroethoxy)tetrahydro-2H-pyran (manufactured by Tokyo Chemical Industry Co., Ltd.) was added thereto. The mixture was stirred at 80° C. and then allowed to cool to room temperature, and water and chloroform (manufactured by Tokyo Chemical Industry Co., Ltd.) were added thereto and separated. The obtained organic layer was concentrated to dryness to obtain 66 g of a brown oil. Column purification or the like was performed on the obtained oil to obtain 17 g of a target product (intermediate 9).

(D3 Step)

A D3 step of the synthesis route described above will be described.

10 mg of phenothiazine (manufactured by Tokyo Chemical Industry Co., Ltd.) was added to 50 mL of super dehydrated tetrahydrofuran (manufactured by Fujifilm Wako Pure Chemical Industries, Ltd.) to prepare a phenothiazine preparation solution. 16 g of the intermediate 9 and 5.0 mL of a phenothiazine preparation solution were mixed in an inert atmosphere, and 0.87 g of 4-dimethylamino pyridine (manufactured by Tokyo Chemical Industry Co., Ltd.) and 2.4 mL of acrylic acid (manufactured by Tokyo Chemical Industry Co., Ltd.) were added thereto. The mixture was cooled with ice water, and then, 15 mL of N,N'-diisopropylcarbodiimide (manufactured by Fujifilm Wako Pure Chemical Industries, Ltd.) was added thereto, and the mixture was returned to room temperature and stirred overnight. The reaction solution was filtered, and the obtained filtrate was mixed with 210 mL of super dehydrated tetrahydrofuran, 1.1 g of 4-dimethylamino pyridine, and 7.3 mL of acrylic acid. The mixture was cooled with ice water, 19 mL of N,N'-diisopropylcarbodiimide was added thereto, and the mixture was returned to room temperature and stirred overnight. The reaction solution was filtered, the filtrate was concentrated under reduced pressure, and then column purification was performed. 5.0 mL of the phenothiazine preparation solution was added to the obtained fraction and concentrated to dryness to obtain 5.9 g of a compound according to Test Example 4 (the compound represented by the chemical formula (11-10)).

NMR was used to identify the structure of the compound according to Test Example 4 (the compound represented by the chemical formula (11-10)). The NMR results are as follows.

1H NMR (CDCl$_3$): 4.24-4.26 (4H), 4.52-4.56 (4H), 5.84-5.88 (2H), 6.12-6.21 (2H), 6.42-6.49 (2H), 6.71-6.78 (3H), 7.51-8.05 (10H), 9.23-9.25 (2H)

Test Example 5

A compound represented by the following chemical formula (11-12) was synthesized, and the compound represented by the following chemical formula (11-12) was used as a compound according to Test Example 5.

(Chem. 38)

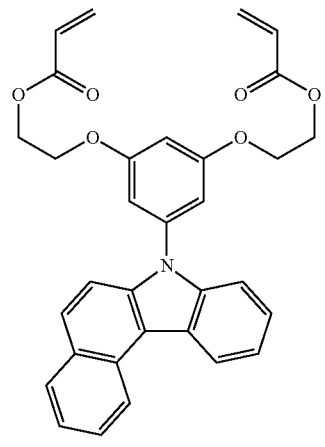

(11-12)

[Method of Synthesizing Compound Represented by Chemical Formula (11-12)]

The method of synthesizing (synthesis route of) the compound represented by the chemical formula (11-12) is as follows.

(Chem. 39)

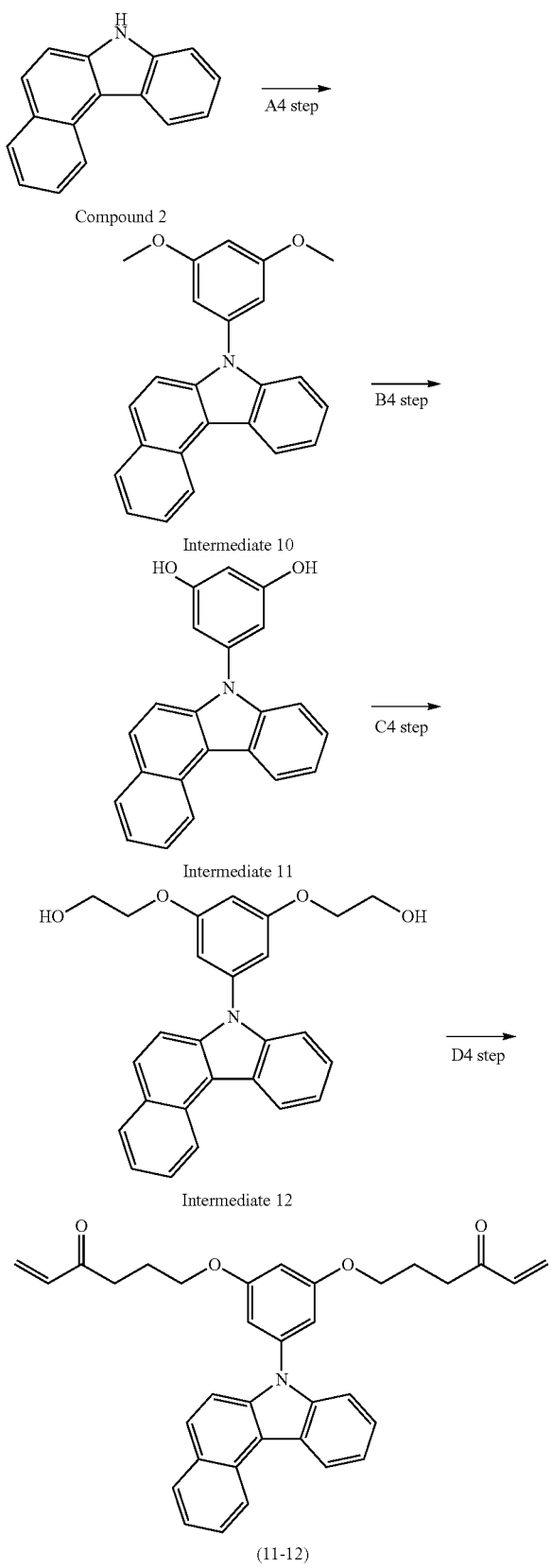

(A4 Step)
An A4 step of the synthesis route described above will be described.

30 g of a compound 2 (7H-benzo[c]carbazole (manufactured by Tokyo Chemical Industry Co., Ltd.)), 60 g of 1-bromo-3,5-dimethoxybenzene (manufactured by Tokyo Chemical Industry Co., Ltd.), and 88 g of tripotassium phosphate (manufactured by Fujifilm Wako Pure Chemical Industries, Ltd.) were mixed in 738 mL of deoxidized toluene (manufactured by Fujifilm Wako Pure Chemical Industries, Ltd.) in an inert atmosphere, 33.0 mL of 1,2-cyclohexanediamine (manufactured by Tokyo Chemical Industry Co., Ltd.) and 26 g of copper iodide(I) (manufactured by Fujifilm Wako Pure Chemical Industries, Ltd.) were added thereto, the mixture was stirred at 120° C. for 50 hours, 8.6 g of 1-bromo-3,5-dimethoxybenzene, 4.7 mL of 1,2-cyclohexanediamine, and 3.8 g copper iodide(I) were added thereto, and the mixture was stirred at 120° C. for 6 hours. After the mixture was allowed to cool, water and chloroform (manufactured by Tokyo Chemical Industry Co., Ltd.) were added thereto, the organic layer extracted by separation was concentrated under reduced pressure, and column purification was performed on the obtained residue to obtain 38 g of a target product (intermediate 10).

(B4 Step)
A B4 step of the synthesis route described above will be described.

37 g of the intermediate 10 was added to 420 mL of chloroform in an inert atmosphere, the mixture was cooled with ice water, and then, 420 mL of a boron tribromide-dichloromethane solution (concentration of 1.0 mol/L, manufactured by Fujifilm Wako Pure Chemical Industries, Ltd.) was added thereto, and the mixture was stirred for 3 hours. The mixture was returned to room temperature, stirred overnight, heated to 40° C., and stirred for 30 minutes. The mixture was returned to room temperature, quenched with water, and extracted with chloroform, and the organic layer was concentrated under reduced pressure. Column purification was performed on the residue, and concentration under reduced pressure or the like was performed to obtain 23 g of a target product (intermediate 11).

(C4 Step)
A C4 step of the synthesis route described above will be described.

243 mL of a sodium hydroxide aqueous solution (concentration of 8.0 mol/L, manufactured by Fujifilm Wako Pure Chemical Industries, Ltd.), 9.0 g of tetrabutylammonium bromide (manufactured by Tokyo Chemical Industry Co., Ltd.), and 23 g of the intermediate 11 were mixed in an inert atmosphere. The mixture was cooled with ice water, and then, 49 mL of 2-(2-chloroethoxy)tetrahydro-2H-pyran (manufactured by Tokyo Chemical Industry Co., Ltd.) was added thereto. The mixture was stirred at 80° C. for 7 hours and then allowed to cool to room temperature, and water and chloroform (manufactured by Tokyo Chemical Industry Co., Ltd.) were added and separate. The extracted organic layer was concentrated to dryness to obtain 87 g of a brown oil. Column purification or the like was performed on the obtained oil to obtain 20 g of a target product (intermediate 12).

(D4 Step)
A D4 step of the synthesis route described above will be described.

6.6 mg of phenothiazine (manufactured by Tokyo Chemical Industry Co., Ltd.) was added to 50 mL of super dehydrated tetrahydrofuran (manufactured by Fujifilm Wako Pure Chemical Industries, Ltd.) to prepare a phenothiazine preparation solution. 16 g of the intermediate 12 and 9 mL of a phenothiazine preparation solution were mixed in an inert atmosphere, 1.0 g of 4-dimethylamino pyridine (manufactured by Tokyo Chemical Industry Co., Ltd.) and 6.7 mL of acrylic acid (manufactured by Tokyo Chemical Industry Co., Ltd.) were added thereto, the mixture was cooled with ice water, 17 mL of N,N'-diisopropylcarbodiimide (manufactured by Fujifilm Wako Pure Chemical Industries, Ltd.) was added thereto, and the mixture was returned to room temperature and stirred for 2 hours. The reaction solution was filtered, and the obtained filtrate was mixed with 240 mL of super dehydrated tetrahydrofuran, 1.3 g of 4-dimethylamino pyridine, and 8.4 mL of acrylic acid. The mixture was cooled with ice water, 22 mL of N,N'-diisopropylcarbodiimide was added thereto, and then, the mixture was returned to room temperature and stirred for 19 hours. Water, chloroform, and saturated saline were added to the reaction solution, an organic layer was extracted, the obtained organic layer was concentrated to dryness, column purification was performed on the obtained residue, 5.0 mL of a phenothiazine preparation solution was added to the obtained fraction, and the mixture was concentrated to dryness to obtain 9.6 g of a compound according to Test Example 5 (the compound represented by the chemical formula (11-12)).

NMR was used to identify the structure of the compound according to Test Example 5 (the compound represented by the chemical formula (11-12)). The NMR results are as follows.

1H NMR (CDCl$_3$): 4.26-4.27 (4H), 4.53-4.55 (4H), 5.85-5.88 (2H), 6.18-6.21 (2H), 6.44-6.48 (2H), 6.67-6.78 (3H), 7.43-7.60 (4H), 7.61-7.63 (1H), 7.70-7.72 (1H), 7.84-7.85 (1H), 7.98-8.01 (1H), 8.62-8.65 (1H), 8.83-8.85 (1H)

The refractive index of the compound (6-3) according to Test Example 1 was 1.78. The refractive index of the compound (6-8) according to Test Example 2 was 1.75. The refractive index of the compound (11-3) according to Test Example 3 was 1.71. The refractive index of the compound (11-10) according to Test Example 4 was 1.75. The refractive index of the compound (11-12) according to Test Example 5 was 1.69. Note that the refractive index was measured by the following method.

An acetone solution or a chloroform solution of each of the compounds according to Test Examples 1 to 5 was prepared, and the average refractive index to light of 589 nm at room temperature of 25±1° C. was measured by an Abbe refractometer (manufactured by ERMA INC., ER-1), and plotted against the volume fraction of each compound to prepare a calibration curve. Note that as the density of each compound, a value determined by a dry densitometer (AccuPyc II 1340-10CC (manufactured by Shimadzu Corporation)) was used (Test Example 1: 1.22 g/cm$^3$, Test Example 2: 1.31 g/cm$^3$). The calibration curve was extrapolated, and the refractive index when the volume fraction of each compound became 1 was used as the refractive index of each compound.

Example 1

(Preparation of Photosensitive Composition 1)

In accordance with the amount shown in Table 1 below, the compound (6-3) according to Test Example 1 and bisphenoxyethanol fluorene diacrylate (manufactured by Osaka Gas Chemical Co., Ltd., "EA-0200", a refractive index: 1.62), polyvinyl acetate (manufactured by Denka Company Limited, "SN-77T"), 1,6-hexanediol diglycidyl ether (manufactured by Nagase ChemteX Corporation, "EX-212L"), Rose Bengal (manufactured by SIGMA-ALDRICH, "RB"), 4-isopropyl-4'-methyldiphenyliodonium tetrakis (pentafluorophenyl) borate (manufactured by Tokyo Chemical Industry Co., Ltd., "10591"), and 2-mercaptobenzoxazole (manufactured by Tokyo Chemical Industry Co., Ltd., "2-MBO") as polymerizable monomers, a binder resin, a plasticizer, a sensitizing dye, a polymerization initiator, and a chain transfer agent were mixed in an acetone solvent at room temperature to prepare a photosensitive composition 1.

(Preparation of Hologram Recording Medium 1)

The photosensitive composition 1 described above was coated on a polyvinyl alcohol film having a thickness of 2.5 μm with a bar coater so as to have a dry film thickness of 3 μm, and then a thin film surface of a photosensitive layer was crimped onto a glass substrate having a thickness of 1.0 mm to obtain the hologram recording medium 1 obtained by stacking a glass substrate, a photosensitive layer, and a polyvinyl alcohol film in this order.

(Preparation of Hologram 1)

Two-beam exposure was performed on the hologram recording medium 1 described above at an exposure amount of 180 mJ/cm$^2$ by using a semiconductor laser with an exposure wavelength of 532 nm, and then the entire surface was irradiated with UV (ultraviolet rays) to cure the uncured monomer, thereby fixing the refractive index distribution to the medium 1. The condition of the two-beam exposure was such that the light intensity of one beam on the recording medium was 3.0 mW/cm$^2$, the exposure was performed for 30 seconds, and the interferometric exposure was performed so that the angle between the two beams was 5.0 degrees. As a result, the refractive index distribution was formed in the hologram recording medium 1 to obtain a hologram 1.

(Evaluation of Hologram 1)

The evaluation of the refractive index modulation amount (Δn) and transparency of the prepared hologram 1 were performed by the following method.

The refractive index modulation amount (Δn) was evaluated from the maximum transmittance and full width at half maximum of the transmittance spectra obtained by entering the hologram, using the coupled-wave theory of Kogelnik (Bell System Technical Journal,48, 2909 (1969)). The transmittance spectra were obtained by measuring the transmittance at 400 to 700 nm using a spot light source manufactured by Hamamatsu Photonics as a light source and a small fiber-optic spectrometer USB-4000 manufactured by Ocean Optics, Inc. as a spectrometer.

Regarding the evaluation of the transparency, with reference to the obtained hologram 1, those in which color is not observed visually equal to or more than the hologram 1 were evaluated as "○", and those in which color is observed visually more than the hologram 1 were evaluated as "×".

Example 2

(Preparation of Photosensitive Composition 2)

In Example 2, a photosensitive composition 2 was obtained using the same material as that in Example 1 in accordance with the amount shown in Table 1 by the same method as that in Example 1 except that the amount of the polymerizable compound was changed as shown in Table 1.

(Preparation of Hologram Recording Medium 2)

A hologram recording medium 2 was prepared using the photosensitive composition 2 described above by the same method as that in Example 1.

(Preparation of Hologram 2)

A hologram 2 was prepared using the hologram recording medium 2 described above in accordance with the exposure condition shown in Table 1 by the same method as that in Example 1.

(Evaluation of Hologram 2)

The refractive index modulation amount ($\Delta n$) and transparency of the prepared hologram 2 were evaluated by the same method as that in Example 1.

Example 3

(Preparation of Photosensitive Composition 3)

In Example 3, a photosensitive composition 3 was obtained using the same material as that in Example 1 in accordance with the amount shown in Table 1 by the same method as that in Example 1 except that a polymerizable compound and the amount thereof were changed as shown in Table 1.

(Preparation of Hologram Recording Medium 3)

The photosensitive composition 3 described above was used to prepare a hologram recording medium 3 by the same method as that in Example 1.

(Preparation of Hologram 3)

The hologram recording medium 3 described above was used to prepare a hologram 3 in accordance with the exposure condition shown in table 1 by the same method as that in Example 1.

(Evaluation of Hologram 3)

The refractive index modulation amount ($\Delta n$) and transparency of the prepared hologram 3 were evaluated by the same method as that in Example 1.

Example 4

(Preparation of Photosensitive Composition 4)

In Example 4, a photosensitive composition 4 was obtained using the same material as that in Example 1 in accordance with the amount shown in Table 1 by the same method as that in Example 1 except that a polymerizable compound and the amount thereof were changed as shown in Table 1.

(Preparation of Hologram Recording Medium 4)

The photosensitive composition 4 described above was used to prepare a hologram recording medium 4 by the same method as that in Example 1.

(Preparation of Hologram 4)

The hologram recording medium 4 was used to prepare a hologram 4 in accordance with the exposure condition shown in Table 1 by the same method as that in Example 1.

(Evaluation of Hologram 4)

The refractive index modulation amount ($\Delta n$) and transparency of the prepared hologram 4 were evaluated by the same method as that in Example 1.

Example 5

(Preparation of Photosensitive Composition 5)

In Example 5, a photosensitive composition 5 was obtained using the same material as that in Example 1 in accordance with the amount shown in Table 1 by the same method as that in Example 1 except that a polymerizable compound and the amount thereof were changed as shown in Table 1.

(Preparation of Hologram Recording Medium 5)

The photosensitive composition 5 described above was used to prepare a hologram recording medium 5 by the same method as that in Example 1.

(Preparation of Hologram 5)

The hologram recording medium 5 described above was used to prepare a hologram 5 in accordance with the exposure condition shown in Table 1 by the same method as that in Example 1.

(Evaluation of Hologram 5)

The refractive index modulation amount ($\Delta n$) and transparency of the prepared hologram 5 were evaluated by the same method as that in Example 1.

Comparative Example 1

(Preparation of Photosensitive Composition 101)

In Comparative Example 1, a photosensitive composition 101 was obtained using the same material as that in Example 1 in accordance with the amount shown in Table 1 by the same method as that in Example 1 except that dinaphthothiophene methacrylate (manufactured by Sugai Chemical IND.CO.,LTD., "DNTMA", a refractive index: 1.89) and bisphenoxyethanol fluorene diacrylate (manufactured by Osaka Gas Chemical Co., Ltd., "EA-0200", a refractive index: 1.62) were used as polymerizable compounds.

(Preparation of Hologram Recording Medium 101)

The photosensitive composition 101 described above was used to prepare a hologram recording medium 101 by the same method as that in Example 1.

(Preparation of Hologram 101)

The hologram recording medium 101 described above was used to prepare a hologram 101 in accordance with the exposure condition shown in Table 1 by the same method as that in Example 1.

(Evaluation of Hologram 101)

The refractive index modulation amount ($\Delta n$) and transparency of the prepared hologram 101 were evaluated by the same method as that in Example 1.

Comparative Example 2

(Preparation of Photosensitive Composition 102)

In Comparative Example 2, a photosensitive composition 102 was obtained using the same material as that in Example 1 in accordance with the amount shown in Table 1 by the same method as that in Example 1 except that acrylic acid 2-(9H-carbazol-9-yl) ethyl (manufactured by SIGMA-ALDRICH, "EACz", a refractive index: 1.65) and bisphenoxyethanol fluorene diacrylate (manufactured by Osaka Gas Chemical Co., Ltd., "EA-0200", a refractive index: 1.62) were used as polymerizable compounds.

(Preparation of Hologram Recording Medium 102)

The photosensitive composition 102 described above was used to prepare a hologram recording medium 102 by the same method as that in Example 1.

(Preparation of Hologram 102)

The hologram recording medium 102 described above was used to prepare a hologram 102 in accordance with the exposure condition shown in Table 1 by the same method as that in Example 1.

(Evaluation of Hologram 102)

The refractive index modulation amount ($\Delta n$) and transparency of the prepared hologram 102 were evaluated by the same method as that in Example 1.

<Experimental Results>

The experimental results of the holograms according to Examples 1 to 5 and Comparative Examples 1 and 2 described above are shown in Table 1. Note that in Table 1, the numerical value of each component is shown by mass %.

and then, a thin film surface of a photosensitive layer was crimped onto a glass substrate having a thickness of 1.0 mm to obtain a hologram recording medium 6 obtained by staking a glass substrate, a photosensitive layer, and a polyvinyl alcohol film in this order.

TABLE 1

|  |  | Example 1 | Example 2 | Example 3 | Example 4 | Example 5 | Comparative Example 1 | Comparative Example 2 |
|---|---|---|---|---|---|---|---|---|
| Composition | Polymerizable compound | | | | | | | |
|  | Compound (6-3) | 20 | 25 | 25 | 25 | 25 | — | — |
|  | Compound (11-3) | — | — | 20 | — | — | — | — |
|  | Compound (11-10) | — | — | — | 20 | — | — | — |
|  | Compound (11 12) | — | — | — | — | 20 | — | — |
|  | DNTMA | — | — | — | — | — | 20 | — |
|  | EACz | | | | | | | 20 |
|  | EA-0200 | 25 | 20 | | | | 25 | 25 |
|  | Binder resin | | | | | | | |
|  | SN-77T | 19.38 | 19.38 | 19.38 | 19.38 | 19.38 | 19.38 | 19.38 |
|  | Plasticizer | | | | | | | |
|  | EX-212L | 30 | 30 | 30 | 30 | 30 | 30 | 30 |
|  | Sensitizing dye | | | | | | | |
|  | RB | 2.25 | 2.25 | 2.25 | 2.25 | 2.25 | 2.25 | 2.25 |
|  | Polymerization initiator | | | | | | | |
|  | 10591 | 8.43 | 8.43 | 8.43 | 8.43 | 8.43 | 8.43 | 8.43 |
|  | Chain transfer agent | | | | | | | |
|  | 2-MBO | 0.55 | 0.56 | 0.56 | 0.56 | 0.56 | 0.56 | 0.56 |
| Exposure conditions | Wavelength (nm) | 532 | 532 | 532 | 532 | 532 | 532 | 532 |
| Evaluation | Refractive index modulation amount ($\Delta n$) | 0.07 | 0.075 | 0.068 | 0.07 | 0.07 | 0.055 | 0.032 |
|  | Transparency | ○ | ○ | ○ | ○ | ○ | X | ○ |

Example 6

(Preparation of Photosensitive Composition 6)

In the amount shown in Table 2 below, the compound (6-3) according to Test Example 1 and bisphenoxyethanol fluorene diacrylate (manufactured by Osaka Gas Chemical Co., Ltd., "EA-0200", a refractive index: 1.62), polyvinyl acetate (manufactured by Denka Company Limited, "SN-55T"), 1,6-hexanediol diglycidyl ether (manufactured by Nagase ChemteX Corporation, "EX-212L"), methylene blue (manufactured by Tokyo Chemical Industry Co., Ltd., "MB"), safranin O (manufactured by Sigma-Aldrich, "SFO"), and Astrazon Orange G (manufactured by Sigma-Aldrich, "AOG"), 4-isopropyl-4'-methyldiphenyliodonium tetrakis (pentafluorophenyl) borate(manufactured by Tokyo Chemical Industry Co., Ltd., "I0591") and tetrabutylammonium butyltriphenylborate (manufactured by Showa Denko, "P3B"), 2-mercaptobenzoxazole (manufactured by Tokyo Chemical Industry Co., Ltd., "2-MBO"), phenothiazine (manufactured by Fujifilm Wako Pure Chemical Industries, Ltd., "PT"), and 9,10-dibutoxyanthracene (manufactured by KAWASAKI KASEI CHEMICALS, "UVS-1331") as polymerizable compounds, a binder resin, a plasticizer, sensitizing dyes, polymerization initiators, a chain transfer agent, a polymerization inhibitor, and a UV sensitizer, respectively, were mixed in a mixed solvent of acetone and ethanol at room temperature to prepare a photosensitive composition 6.

(Preparation of Hologram Recording Medium 6)

The photosensitive composition 6 described above was coated on a polyvinyl alcohol film having a thickness of 2.5 μm by a bar coater so as to have a dry film thickness of 5 μm, (Preparation of Hologram 6)

Two-beam exposure was performed on the hologram recording medium 6 described above at the total exposure amount of 2832 mJ/cm$^2$ by using a semiconductor laser with the exposure wavelengths of 457 nm, 532 nm, and 660 nm so that the respective colors overlap with each other, and then the entire surface was irradiated with UV (ultraviolet rays) to cure the uncured monomer, thereby fixing the refractive index distribution to the medium 6. The condition of the two-beam exposure was such that the light intensity of one beam of each of 457 nm, 532 nm, and 660 nm on the recording medium was 2.0 mW/cm$^2$, 4.2 mW/cm$^2$, and 5.7 mW/cm$^2$, respectively, the exposure was performed for 120 seconds, and the interferometric exposure was performed so that the angle between the two beams was 3.0 degrees. As a result, the refractive index distribution was formed in the hologram recording medium 6 to obtain a hologram 6.

(Evaluation of Hologram 6)

Evaluation of the total refractive index modulation amount ($\Delta n$) and transparency of the prepare hologram 6 was performed by the following method.

Regarding the total refractive index modulation amount ($\Delta n$), evaluation was performed for each hologram corresponding to each exposure wavelength from the maximum transmittance and full width at half maximum of the peak corresponding to each exposure wavelength of the transmittance spectra obtained by entering the hologram, using the coupled-wave theory of Kogelnik (Bell System Technical Journal, 48, 2909 (1969)), and the total amount of the obtained $\Delta n$ was determined. The transmittance spectra were obtained by measuring the transmittance at 400 to 700 nm using a spot light source manufactured by Hamamatsu Photonics as a light source and a small fiber-optic spectrometer USB-4000 manufactured by Ocean Optics, Inc. as a spectrometer.

Regarding the evaluation of the transparency, with reference to the obtained hologram 6, those in which color is not observed visually equal to or more than the hologram 6 were evaluated as "○", and those in which color is observed visually more than the hologram 6 were evaluated as "×".

Example 7

(Preparation of Photosensitive Composition 7)
In Example 7, a photosensitive composition 7 was obtained using the same material as that in Example 6 in accordance with the amount shown in Table 2 by the same method as that in Example 6 except that the compound (6-3) according to Test Example 1, the compound (6-8) according to Test Example 2, and bisphenoxyethanol fluorene diacrylate (manufactured by Osaka Gas Chemical Co., Ltd., "EA-0200", a refractive index: 1.62) were used as polymerizable compounds, the amount of the polymerizable compounds was changed as shown in Table 2, and a mixed solvent of ethanol and chloroform was used as a solvent.

(Preparation of Hologram Recording Medium 7)
The photosensitive composition 7 described above was used to prepare a hologram recording medium 7 by the same method as that in Example 6.

(Preparation of Hologram 7)
The hologram recording medium 7 described above was used to prepare a hologram 7 in accordance with the exposure condition shown in Table 2 by the same method as that in Example 6.

(Evaluation of Hologram 7)
The total refractive index modulation amount ($\Delta n$) and transparency of the prepared hologram 7 were evaluated by the same method as that in Example 6.

Comparative Example 3

(Preparation of Photosensitive Composition 103)
In Comparative Example 3, a photosensitive composition 103 was obtained using the same material as that in Example 6 in accordance with the amount shown in Table 2 by the same method as that in Example 6 except that acrylic acid 2-(9H-carbazol-9-yl) ethyl (manufactured by SIGMA-ALDRICH, "EACz", a refractive index:1.65) and bisphenoxyethanol fluorene diacrylate (manufactured by Osaka Gas Chemical Co., Ltd., "EA-0200", a refractive index: 1.62) were used as polymerizable compounds.

(Preparation of Hologram Recording Medium 103)
The photosensitive composition 103 described above was used to prepare a hologram recording medium 103 by the same method as that in Example 6.

(Preparation of Hologram 103)
The hologram recording medium 103 described above was used to prepare a hologram 103 in accordance with the exposure condition shown in Table 2 by the same method as that in Example 6.

(Evaluation of Hologram 103)
The total refractive index modulation amount ($\Delta n$) and transparency of the prepared hologram 103 were evaluated by the same method as that in Example 6.

TABLE 2

|  |  | Example 6 | Example 7 | Comparative Example 3 |
|---|---|---|---|---|
| Composition | Polymerizable compound | | | |
|  | Compound(6-3) | 25 | 25 | — |
|  | Compound(6-8) | — | 15 | — |
|  | EACz | — | — | 8.2 |
|  | EA-0200 | 20 | 5 | 36.8 |
|  | Binder resin | | | |
|  | SN-55T | 19.38 | 19.38 | 19.38 |
|  | Plasticizer | | | |
|  | EX-212L | 30 | 30 | 30 |
|  | Sensitizing dye | | | |
|  | MB | 0.47 | 0.47 | 0.47 |
|  | SFO | 0.075 | 0.075 | 0.075 |
|  | AOG | 0.78 | 0.78 | 0.78 |
|  | Polymerization initiator | | | |
|  | I0591 | 8.43 | 8.43 | 8.43 |
|  | P3B | 3.42 | 3.42 | 3.42 |
|  | Chain transfer agent | | | |
|  | 2-MBO | 0.56 | 0.56 | 0.56 |
|  | Polymerization inhibitor | | | |
|  | PT | 0.08 | 0.08 | 0.08 |
|  | UV sensitizer | | | |
|  | UVS-1331 | 1.39 | 1.39 | 1.39 |
| Exposure conditions | Wavelength (nm) | 457/532/660 | 457/532/660 | 457/532/660 |
| Evaluation | Total refractive index modulation amount ($\Delta n$) | 0.068 | 0.07 | 0.046 |
|  | Transparency | ○ | ○ | ○ |

From Tables 1 and 2, it was found that the hologram containing the compound (6-3), the compound (6-8), the compound (11-3), the compound (11-10), or the compound (11-12) had a high refractive index modulation amount (Δn) and was excellent in transparency.

As described above, in accordance with the present technology, it is possible to obtain a hologram having excellent diffraction characteristics by combining the above-mentioned compound represented by the general formula (1), a binder resin, and a photoinitiator with each other.

REFERENCE SIGNS LIST 1 hologram recording medium
11 transparent protective film (transparent base material)
12 photosensitive layer
13 glass or film substrate (transparent base material)

The invention claimed is:

1. A photosensitive composition, consisting of:
radically polymerizable compounds consisting of bisphenoxyethanol fluorene diacrylate and a compound represented by a general formula (6-3):

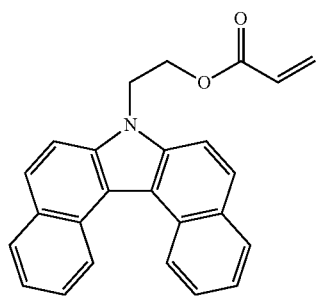

(6-3)

polyvinyl acetate as a binder resin;
1,6-hexanediol diglycidyl ether as a plasticizer;
rose bengal as a sensitizing dye;
4-isopropyl-4'-methyldiphenyliodonium tetrakis (pentafluorophenyl) borate as a polymerization initiator; and
2-mercaptobenzoxazole as a chain transfer agent,
wherein the photosensitive composition is capable of a refractive index modulation amount that is 0.07 or greater.

2. A hologram recording medium comprising the photosensitive composition according to claim 1.

3. A hologram optical element recorded in the hologram recording medium according to claim 2.

4. The photosensitive composition according to claim 1, wherein the compound is in an amount of 25 mass % or less, and wherein bisphenoxyethanol fluorene diacrylate is in an amount of 25 mass % or less.

5. The photosensitive composition according to claim 4, wherein the amount of the compound ranges from 20 mass % to 25 mass %, and wherein bisphenoxyethanol fluorene diacrylate ranges from 20 mass % to 25 mass %.

6. A method of forming a hologram diffraction grating, comprising:
causing a hologram recording medium that includes a photosensitive layer including a photosensitive composition, wherein the photosensitive composition consists of radically polymerizable compounds consisting of bisphenoxyethanol fluorene diacrylate and a compound represented by a general formula (6-3) shown below; polyvinyl acetate as a binder resin; 1,6-hexanediol diglycidyl ether as a plasticizer; rose bengal as a sensitizing dye; 4-isopropyl-4'-methyldiphenyliodonium tetrakis (pentafluorophenyl) borate as a polymerization initator; and 2-mercaptobenzoxazole as a chain transfer agent to react by electromagnetic radiation whose amplitude intensity has been spatially modulated interference pattern:

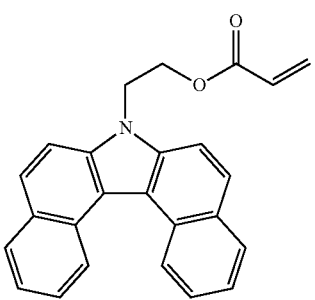

(6-3)

wherein the photosensitive layer is capable of a refractive index modulation amount that is 0.07 or greater.

* * * * *